(12) United States Patent
Ubahara et al.

(10) Patent No.: US 9,093,356 B2
(45) Date of Patent: Jul. 28, 2015

(54) SEMICONDUCTOR LIGHT EMITTING ELEMENT

(75) Inventors: Nobuhiko Ubahara, Tokushima (JP); Kouichiroh Deguchi, Tokushima (JP); Takao Yamada, Komatsujima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 13/336,667

(22) Filed: Dec. 23, 2011

(65) Prior Publication Data

US 2012/0161183 A1 Jun. 28, 2012

(30) Foreign Application Priority Data

Dec. 28, 2010 (JP) ................................. 2010-294304

(51) Int. Cl.
*H01L 33/20* (2010.01)
*H01L 27/15* (2006.01)
*H01L 33/00* (2010.01)
*H01L 33/08* (2010.01)
*H01L 33/38* (2010.01)
*H01L 33/40* (2010.01)

(52) U.S. Cl.
CPC .......... *H01L 27/156* (2013.01); *H01L 33/0079* (2013.01); *H01L 33/08* (2013.01); *H01L 33/20* (2013.01); *H01L 33/38* (2013.01); *H01L 33/405* (2013.01)

(58) Field of Classification Search
CPC .............................. H01L 33/46; H01L 27/156
USPC ........ 257/13, 94, 98, 103, E21.001, E33.061, 257/E33.064, E33.056, E33.072, 88; 438/27
See application file for complete search history.

(56) References Cited

U.S. PATENT DOCUMENTS

| | | | |
|---|---|---|---|
| 6,744,071 B2 * | 6/2004 | Sano et al. ...................... 257/79 |
| 8,063,410 B2 * | 11/2011 | Fudeta ............................ 257/98 |
| 2002/0030201 A1 | 3/2002 | Uemura | |
| 2003/0141506 A1 | 7/2003 | Sano et al. | |
| 2004/0072383 A1 | 4/2004 | Nagahama et al. | |
| 2004/0104390 A1 | 6/2004 | Sano et al. | |
| 2005/0035364 A1 | 2/2005 | Sano et al. | |
| 2005/0211993 A1 | 9/2005 | Sano et al. | |
| 2006/0128118 A1 | 6/2006 | Nagahama et al. | |
| 2006/0220148 A1 * | 10/2006 | Furukawa et al. ............. 257/374 |
| 2008/0296609 A1 | 12/2008 | Nagahama et al. | |
| 2009/0315045 A1 | 12/2009 | Horie | |
| 2010/0032701 A1 | 2/2010 | Fudeta | |
| 2010/0099212 A1 | 4/2010 | Yang et al. | |
| 2010/0264443 A1 | 10/2010 | Wakai et al. | |

(Continued)

FOREIGN PATENT DOCUMENTS

JP U-63-010575 1/1988
JP U-63-031556 3/1988

(Continued)

*Primary Examiner* — Mamadou Diallo
*Assistant Examiner* — Christina Sylvia
(74) *Attorney, Agent, or Firm* — Foley & Lardner LLP

(57) ABSTRACT

A semiconductor light emitting element comprises a semiconductor laminate including a p-type semiconductor layer, an active layer and an n-type semiconductor layer which are sequentially laminated; and a conductive support substrate joined to the p-type semiconductor layer side of the semiconductor laminate. The semiconductor laminate is divided into at least two semiconductor regions by a trench penetrating the p-type semiconductor layer, the active layer and the n-type semiconductor layer.

20 Claims, 25 Drawing Sheets

(56) References Cited

U.S. PATENT DOCUMENTS

| | | |
|---|---|---|
| 2011/0008924 A1 | 1/2011 | Yang et al. |
| 2012/0032144 A1 | 2/2012 | Fudeta |
| 2015/0014716 A1* | 1/2015 | von Malm ............ 257/89 |

FOREIGN PATENT DOCUMENTS

| | | | |
|---|---|---|---|
| JP | U-63-043463 | | 3/1988 |
| JP | U-63-043464 | | 3/1988 |
| JP | 2002-026386 | | 1/2002 |
| JP | 2004-079972 | | 3/2004 |
| JP | 2004079972 A | * | 3/2004 |
| JP | 2004-266240 | | 9/2004 |
| JP | 2010-027643 | | 2/2010 |
| JP | 2010-040761 | | 2/2010 |
| JP | 2010027643 A | * | 2/2010 |
| JP | 2010-098288 | | 4/2010 |
| JP | 2010-192837 | | 9/2010 |
| WO | WO-03/065464 A1 | | 8/2003 |
| WO | WO-2007/126092 A1 | | 11/2007 |
| WO | WO-2009/084670 A1 | | 7/2009 |

* cited by examiner

SEMICONDUCTOR LIGHT EMITTING ELEMENT

BACKGROUND OF THE INVENTION

1. Field of the Invention

The present invention relates to a semiconductor light emitting element and a manufacturing method thereof.

2. Description of the Related Art

In recent years, an increase in the size of semiconductor light emitting elements has been required. However, when the size of the semiconductor light emitting element is increased, a defective region is more likely to be generated in a semiconductor laminate of the element. A semiconductor light emitting element having a defective region in a part of the semiconductor laminate is determined to be defective, even when most of the regions in the semiconductor laminate are acceptable. Therefore, the number of large-sized semiconductor light emitting elements that can be formed from one piece of wafer is decreased, which results in poor yield. Further, the acceptable regions are disadvantageously wasted.

For the purpose of effectively using the acceptable regions, a method may be used which involves connecting a plurality of small-sized elements to thereby form a large-sized chip (see, for example, JP-A-2010-192837). In this method, a large-sized chip is subjected to dicing so as not to contain defective small-sized elements, while acceptable small-sized elements remaining together with the defective small-sized elements are subjected to dicing to produce medium-sized chips. Thus, the number of wasted acceptable regions is reduced, which can improve the yield of the large and medium-sized chips.

A laminated semiconductor light emitting element may be formed by growing a semiconductor laminate on a growth substrate, bonding the semiconductor laminate to a conductive support substrate, and then removing the growth substrate (see, for example, JP-A-2004-266240 and International Publication No. WO 2003/065464 pamphlet).

Another problem caused by increasing the size of the semiconductor light emitting element is warpage. In case of a laminated semiconductor light emitting element, warpage is caused by the difference in a thermal expansion coefficient between the growth substrate and the semiconductor element, and the warpage remains in the semiconductor laminate even when the growth substrate is removed.

Still another problem caused by increasing the size of the semiconductor light emitting element is the reduction in efficiency of light extraction. A part of light generated by an active layer of the semiconductor laminate is laterally transmitted, while being reflected by the upper and lower surfaces of the semiconductor laminate. The light reaching the side of the semiconductor laminate is emitted toward the outside of the element. In a large-sized semiconductor light emitting element, the average distance traveled by the light until it reaches the side of the semiconductor light emitting element becomes long, which increases the number of reflections of the light before it is emitted from the light emitting element. When the light is reflected (in particular, reflected off an interface between the substrate and the semiconductor laminate), the light is absorbed. Thus, as the number of reflections of the light is increased, the intensity of the light emitted from the light emitting element is reduced.

In a laminated semiconductor light emitting element formed using a semiconductor laminate containing a nitride, a distance (thickness of a p-type semiconductor layer) between the substrate and the active layer is short. Therefore, light may be repeatedly reflected before being emitted from the light emitting element. Such repeatedly reflected light tends to be absorbed at the interface between the substrate and the semiconductor laminate. Thus, there is a need for a large-sized laminated semiconductor light emitting element having improved light extraction efficiency.

SUMMARY OF THE INVENTION

Accordingly, an object of the present invention is to provide a large-sized laminated semiconductor light emitting element which has reduced warpage and improved light extraction efficiency, and a manufacturing method thereof.

A semiconductor light emitting element of the present invention includes a semiconductor laminate including a p-type semiconductor layer, an active layer and an n-type semiconductor layer which are sequentially laminated, and a conductive support substrate joined to the p-type semiconductor layer side of the semiconductor laminate. The semiconductor laminate is divided into at least two semiconductor regions by a trench penetrating the p-type semiconductor layer, the active layer and the n-type semiconductor layer.

A method for manufacturing a semiconductor light emitting element of the present invention includes a growing step of forming the semiconductor laminate by sequentially growing the n-type semiconductor layer, the active layer, and the p-type semiconductor layer over a growth substrate, a joining step of joining the p-type semiconductor layer to the support substrate, a removing step of removing the growth substrate, and a chip formation step of dividing the support substrate into the semiconductor light emitting elements. The semiconductor laminate is divided into a plurality of semiconductor regions by trenches before the chip formation step. In the chip formation step, the support substrate is divided along the trench to thereby provide the semiconductor light emitting element containing at least two semiconductor regions.

In the semiconductor light emitting device of the present invention, since the semiconductor laminate is divided into a plurality of semiconductor regions, stress accumulated inside the semiconductor laminate can be released. That is, warpage of the semiconductor light emitting element can be reduced by constituting a large-sized laminated semiconductor light emitting element from a plurality of regions. In the semiconductor light emitting element of the present invention, the division of the semiconductor laminate into a plurality of semiconductor regions can shorten the average distance traveled by the light emitted from the active layer until it reaches the sides. Therefore, the number of reflections of the light inside the semiconductor laminate can be educed, thus improving the light extraction efficiency.

According to the manufacturing method of the present invention, since a semiconductor laminate is divided into a plurality of semiconductor regions by trenches before the chip formation step, it is possible to obtain a semiconductor light emitting element chip which has less warpage after the chip formation step, and also has satisfactory light extraction efficiency.

According to the semiconductor light emitting element of the present invention, it is possible to provide a large-sized laminated semiconductor light emitting element which has reduced warpage and improved light extraction efficiency. According to the manufacturing method of the present invention, it is possible to provide a large-sized laminated semiconductor light emitting element which has reduced warpage and improved light extraction efficiency.

DETAILED DESCRIPTION OF THE INVENTION

Figure 1:
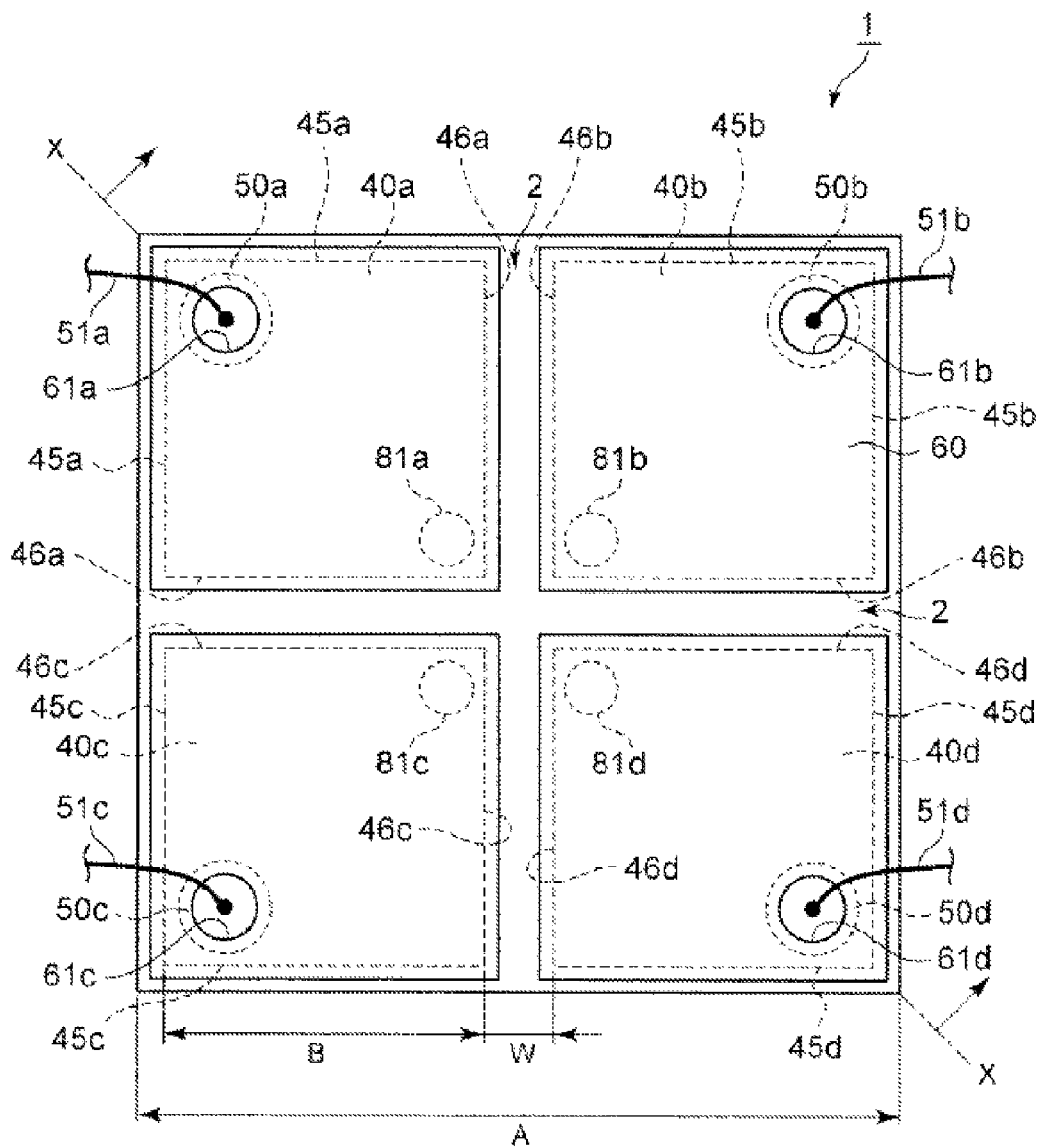
FIG. 1 is a schematic top view of a semiconductor light emitting element according to a first embodiment.

Embodiments of the present invention will be described in detail below with reference to the accompanying drawings. In the following description, terms indicative of the specific directions or positions (for example, "upper", "lower", "right", "left", and other terms containing these terms) will be used if necessary. These terms are used for easy understanding of the invention with reference to the accompanying drawings. The technical scope of the present invention is not limited by the meaning of these terms. Parts designated by the same reference character in the drawings indicate the same part or member.

First Embodiment

Figure 2:
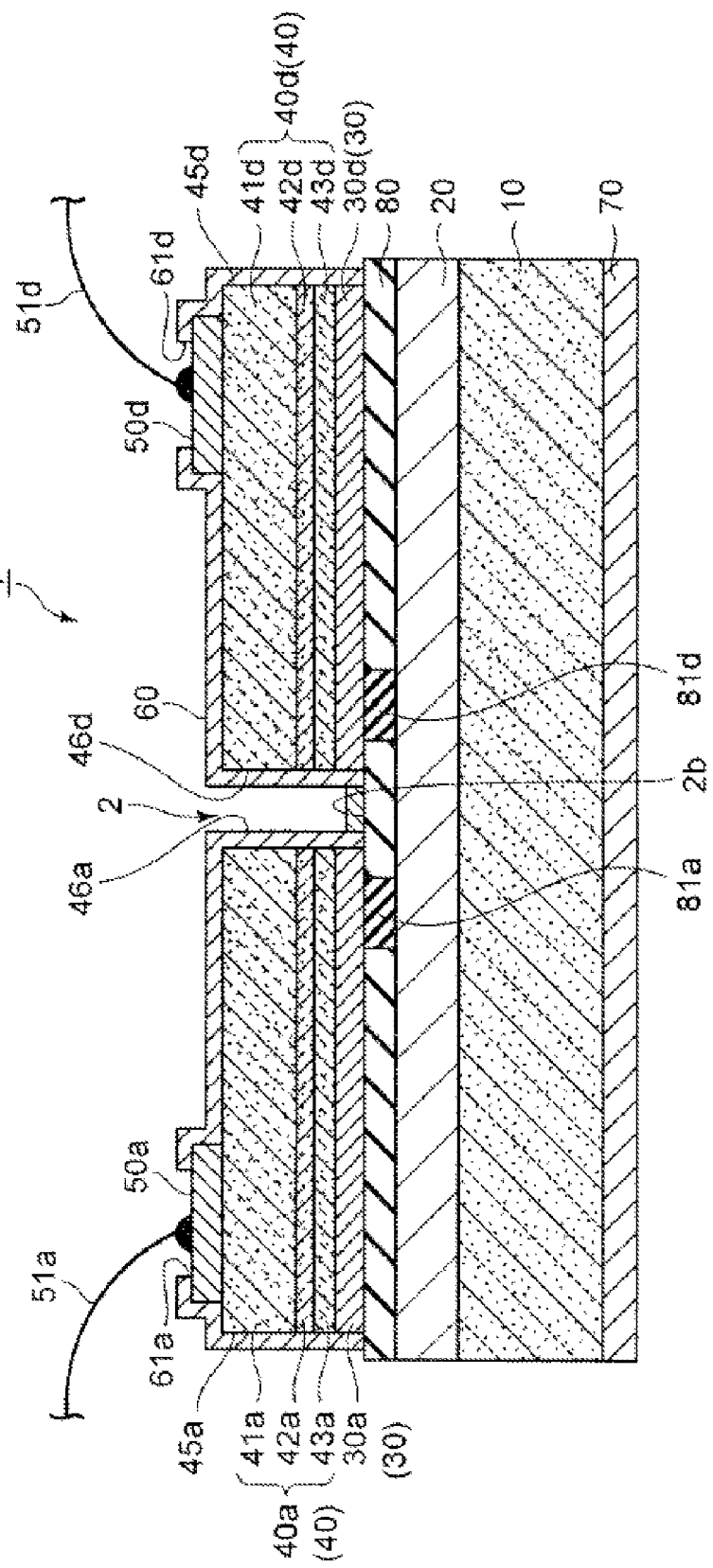
FIG. 2 is a schematic cross-sectional view of the semiconductor light emitting element depicted in FIG. 1, taken along the line X-X as shown in FIG. 1.

FIGS. 1 and 2 illustrate the semiconductor light emitting element 1 according to the present embodiment. The semiconductor light emitting element 1 includes a junction layer 20, a reflection layer 30, and a semiconductor laminate 40 which are laminated over an upper surface of a conductive support substrate 10. The semiconductor laminate 40 is divided into a plurality of semiconductor regions 40a to 40d (four in FIG. 1) by trenches 2. As shown in FIG. 2, each of the semiconductor regions 40a to 40d includes a p-type semiconductor layer 43 (43a, 43d), an active layer 42 (42a, 42d), and an n-type semiconductor layer 41 (41a, 41d) which are sequentially laminated.

N-side pads 50 (50a to 50d) are formed over the n-type semiconductor layers 41a to 41d in the semiconductor regions 40a to 40d. The surfaces of the semiconductor regions 40a to 40d except for parts of the n-side pads 50 are covered with a transparent outer protective film 60.

A backside metallized layer 70 is formed at the back surface of the support substrate 10. The backside metallized layer 70 serves as an ohmic electrode of the support substrate 10.

An insulating film (for example, $SiO_2$ film) is preferably disposed instead of the reflection layer 30 in a region of the reflection layer 30 directly under the n-side pad 50. That is, the insulating film is disposed directly under the n-side pad 50 in the reflection layer 30 shown in FIG. 2, and the reflection layer 30 is provided around the insulating film. This arrangement can prevent the current from flowing through only the region directly under the n-side pad 50.

When a stretched electrode (to be described later) electrically connected to the n-side pad 50 is provided, all of the n-side pads 50 and the stretched electrodes may not be in contact with an n-type semiconductor layer 41. For example, an insulating film may be disposed at a portion between the n-type semiconductor layer 41, and the n-side pad 50 and stretched electrode (for example, between the n-side pad 50 and the n-type semiconductor layer 41), and other parts (for example, the stretched electrode) may be in contact with the n-type semiconductor layer 41. In this case, the reflection layer 30 may be provided over the entire p-type semiconductor layer 43.

In the present embodiment, the protective film 80 may be provided and a through hole 81a may be formed in the protective film 80. The through hole 81a is preferably not formed directly under the n-type pad 50. The protective film 80 and the through hole 81a are not essential, and thus may be omitted. When the through hole 81 is provided, material from the junction layer may be deposited in the through hole when the junction layer is deposited.

In the semiconductor light emitting element 1 of the present embodiment, the support substrate 10 is joined to the p-type semiconductor layers 43a or 43d side of each of the semiconductor regions 40a to 40d via the protective film 80 and the reflection layer 30. The semiconductor laminates 40a and 40d are divided into the semiconductor regions 40a to 40d by the trenches 2 penetrating the p-type semiconductor layers 43a and 43d, the active layers 42a and 42d, and the n-type semiconductor layers 41a and 41d.

When the semiconductor laminate 40 is divided into the semiconductor regions 40a to 40d by the trenches 2, the light transmitted laterally from the active layers 42a and 42d can be emitted from any one of the outer sides 45a to 45d facing toward the outside and the inner sides 46a to 46b facing the trenches 2 among all sides of the semiconductor regions 40a to 40d. The light emitted from the inner sides 46a to 46d are reflected by the trenches 2 (specifically, the light emitted into the trenches 2 between the semiconductor regions 40a and 40b is reflected off the inner sides 46a and 46b) and emitted toward the outside of the trenches 2.

In large-sized semiconductor light emitting elements without any trenches 2, light transferred laterally though a semiconductor laminate is reflected by the upper and lower surfaces of the laminate to be emitted from an outer side (corresponding to the outer sides 45a to 45d shown in FIG. 1) toward the outside. In contrast, in the semiconductor light emitting element 1 of the present invention shown in FIG. 1, the light can be emitted not only from the outer sides 45a to 45d, but also from the inner sides 46a to 46d toward the outside. Thus, the semiconductor light emitting element 1 of the present invention has about one half the average propagation distance traveled by light in the conventional large-sized semiconductor light emitting element. Thus, the number of reflections of the light inside the semiconductor laminate 40 is decreased to about one half that in the conventional large-sized semiconductor light emitting element. Light is absorbed while being reflected inside the semiconductor laminate 40. As the number of reflections of the light is decreased, the intensity of the light emitted from the light emitting element becomes stronger.

As mentioned above, the division of the semiconductor laminate 40 into the semiconductor regions 40a to 40d can shorten the average distance traveled by the light emitted from the active layer 42 until it reaches the sides 45a to 45d and 46a to 46d, which can decrease the number of reflections of the light inside the semiconductor laminate 40, thus improving the light extraction efficiency.

In the present embodiment, the reflection layer 30 is preferably disposed between the support substrate 10 and the semiconductor laminate 40 (see FIG. 2). The absorption of light is remarkable when the light is reflected by an interface between the semiconductor laminate 40 and the support substrate 10. This is because the light is apt to be absorbed in the support substrate 10. According to the present embodiment, the light directed from the semiconductor laminate 40 to the support substrate 10 is effectively reflected, which can suppress the absorption of the light. The provision of the reflection layer 30 can keep the high intensity of the light transmitted through the semiconductor laminate 40, and thus can improve the light extraction efficiency.

In the semiconductor light emitting element of the present invention, the ratio of the thickness of the p-type semiconductor layer 43 to that of the n-type semiconductor layer 41 is set to 1:3 to 1:50, whereby the p-type semiconductor layer 43 can be made relatively thin. The thinning of the p-type semiconductor layer 43 causes the active layer 42 to get close to the support substrate 10 (see FIG. 2). That is, the light emitted from the active layer 42 is likely to be absorbed in the adjacent support substrate 10, which can make the light extraction efficiency worse. In the present invention, however, the division of the semiconductor laminate 40 into the semiconductor regions 40a to 40d by the trenches 2 can suppress the absorption of the light until the light is emitted toward the outside, and thus can relieve the deterioration of the light extraction efficiency.

When the p-type semiconductor layer 43 is thin, the reflection layer 30 is preferably provided between the support substrate 10 and the semiconductor laminate 40. The light emitted by the active layer 42 is reflected by the reflection layer 30 before being absorbed in the adjacent support substrate 10, which can effectively suppress the absorption of the light in the support substrate 10.

The reflection layer 30 can be formed of a metal film. Thus, the reflection layer 30 can also serve as a p-side electrode for conduction between the p-type semiconductor layer 43 and the support substrate 10. In particular, the metal film formed of an Ag film or Al film has a high reflectivity of the light, and thus can improve the light extraction efficiency of the semiconductor light emitting element 1.

As shown in FIG. 2, the insulating protective film 80 and the reflection layer 30 are preferably further provided in that order from the support substrate 10 side between the support substrate 10 and the semiconductor laminate 40. The provision of the reflection layer 30 between the active layer 42 and the support substrate 10 can suppress the absorption of light transmitted through the inside of the semiconductor laminate 40.

The provision of the insulating protective film 80 between the support substrate 10 and the reflection layer 30 interrupts the conduction between the reflection layer 30 and the support substrate 10. For this reason, it is necessary to ensure the conduction by providing the through holes 81 (81a to 81d) in the protective film 80. The appropriate designing of the shape, dimension, and position of formation of the through holes 81 can control a route of current flowing through the semiconductor laminate 40. For example, the rectangular semiconductor region 40a shown in FIG. 1 is formed such that the n-side pad 50a and the through hole 81a are diagonally opposed to each other, whereby current can flow widely inside the semiconductor region 40a. The presence of the protective film 80 at the bottom 2b of the trench 2 can insulate areas between the semiconductor regions 40a to 40d.

When the reflection layer 30 is formed of material that tends to cause migration (for example, Ag or the like), the formation of the reflection layer 30 at the bottom 2b of the trench 2 would make a short circuit between the semiconductor regions 40a to 40d, or between the p-type semiconductor layer 43, the active layer 42, and the n-type semiconductor layer 41 inside the semiconductor regions 40a to 40d due to the migration. In the present embodiment, however, the formation of only the protective film 80 at the bottom 2b of the trench 2 can solve the problem of the short circuit.

The protective film 80 is formed of a dielectric multilayered film, and can serve as a reflection member for reflecting the light. For example, in the semiconductor light emitting element 1 shown in FIG. 2, the protective film 80 and not the reflection layer 30 is formed at the bottom 2b of the trench 2. A part of light emitted from the inner sides 46a to 46d of the semiconductor regions 40a to 40d is directed toward the bottom 2b of the trench 2, and applied to the protective film 80. The protective film 80 formed of a dielectric multilayered film can cause the light to be reflected by the protective film 80 and to be taken out toward the outside of the trench 2. Thus, the protective film 80 is formed of the dielectric multilayered film, which can improve the light extraction efficiency of the semiconductor light emitting element 1.

The width W of the trench 2 (see FIG. 1) is preferably 25 μm or less. In the large-sized semiconductor light emitting element, current does not flow through the entire element, and thus a light emitting surface does not uniformly emit light therefrom. Thus, by running a long stretched electrode throughout the element, the current flows through the entire element. The stretched electrode is normally formed of a metal film having a width of 5 to 50 μm, and a part of the element with the stretched electrode formed therein is prevented from being irradiated with the light. In the present invention, the division of the semiconductor laminate into the semiconductor regions 40a to 40d by the trenches 2 can achieve the relatively uniform light emission without using the stretched electrode, or only by a short stretched electrode. However, the regions with the trenches 2 formed therein are those not emitting the light therefrom since parts of the semiconductor laminate 40 corresponding to the regions are removed. A semiconductor light emitting element provided with the trench 2 having a width of more than 25 μm is not preferable from the viewpoint of the light extraction efficiency as compared to a large-sized semiconductor light emitting element 1 provided with the long stretched electrode.

The width of the trench 2 generally formed is 3 μm or more. The use of the present etching technique (wet etching and dry etching) makes it difficult to accurately form the trench having a width of less than 3 μm. The trenches 2 shown in the Figures have vertical sides, such that the trenches 2 are elongated rectangular trenches. However, other trench shapes are possible. For example, the trenches 2 may have sloping sides, such that the trenches 2 are elongated V-shaped trenches. In this case, the "width" refers to the maximum width of the trench. Of course, the shape of the trenches 2 will depend on the method used to create the trenches 2.

The semiconductor light emitting element 1 may have a rectangular shape as viewed from the top surface. The ratio of the length A of one side of the rectangle to the width W of the trench 2 extending in the direction perpendicular to the one side is preferably 100:25 or more. The formation of the trenches 2 causes the light to emit from the inner sides 46a to 46d of the semiconductor regions 40a to 40d, which improves the light extraction efficiency. However, a part of the semiconductor laminate 40 located in the region with the trench 2 formed therein is removed, and becomes the region not emitting the light. The ratio of the length A of one side of the semiconductor light emitting element 1 to the width W of the trench 2 of less than 100:25 is not preferable from the viewpoint of the light extraction efficiency as compared to a semiconductor light emitting element without the trench 2.

The ratio of the length A of one side of the semiconductor light emitting element to the width W of the trench 2 is normally 100:0.28 or less. This is a upper limit when the length A of one side is 1.4 mm and the width W of the trench is 3 μm.

Each of the semiconductor regions 40a to 40d has a rectangular shape as viewed from the top surface. The ratio of the length B of one side of the rectangle to the width W of the trench 2 extending in the direction perpendicular to the one side is preferably more than 10:1. The ratio of less than 10:1 is not preferable since light extraction efficiency is reduced as compared to the semiconductor light emitting element without the trenches 2.

Figure 3A:
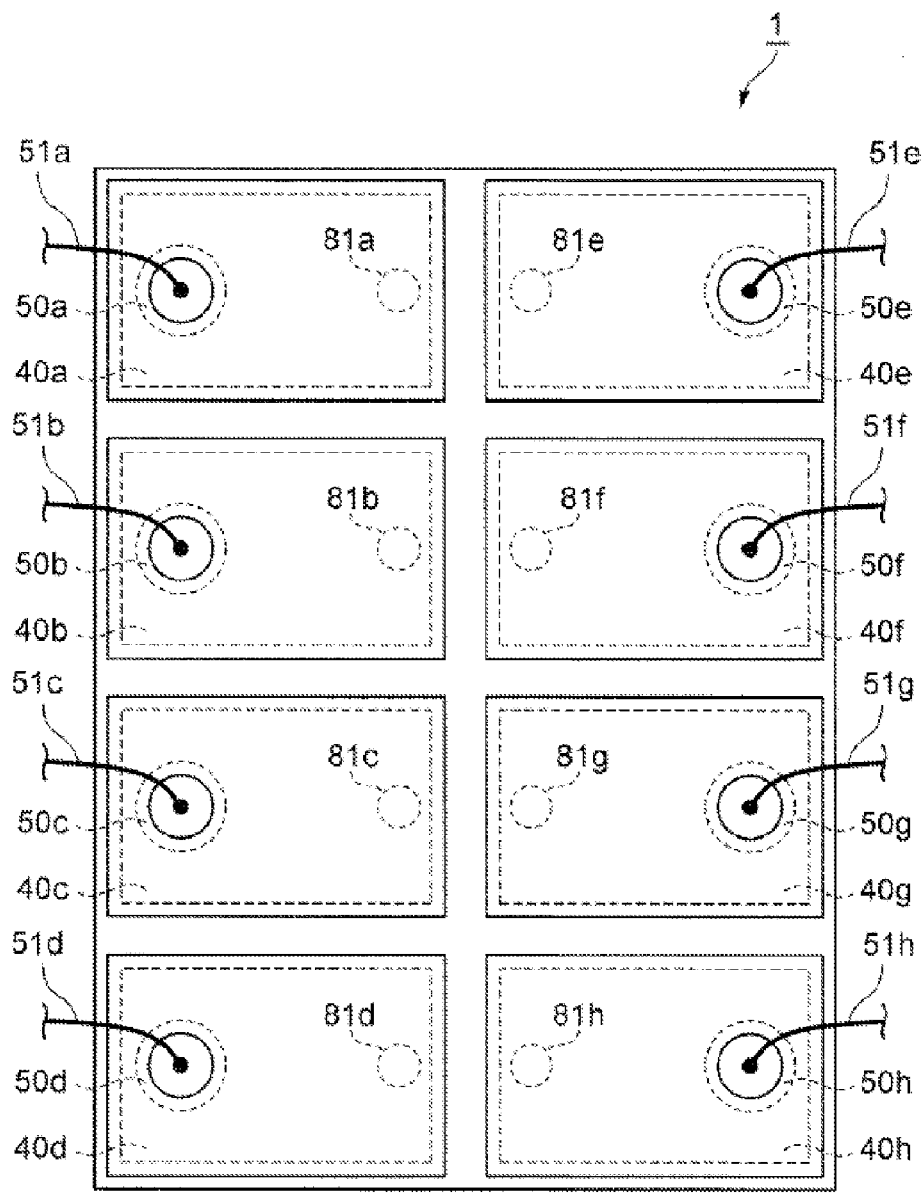
FIG. 3A is a schematic top view of a semiconductor light emitting element according to one embodiment.
Figure 3B:
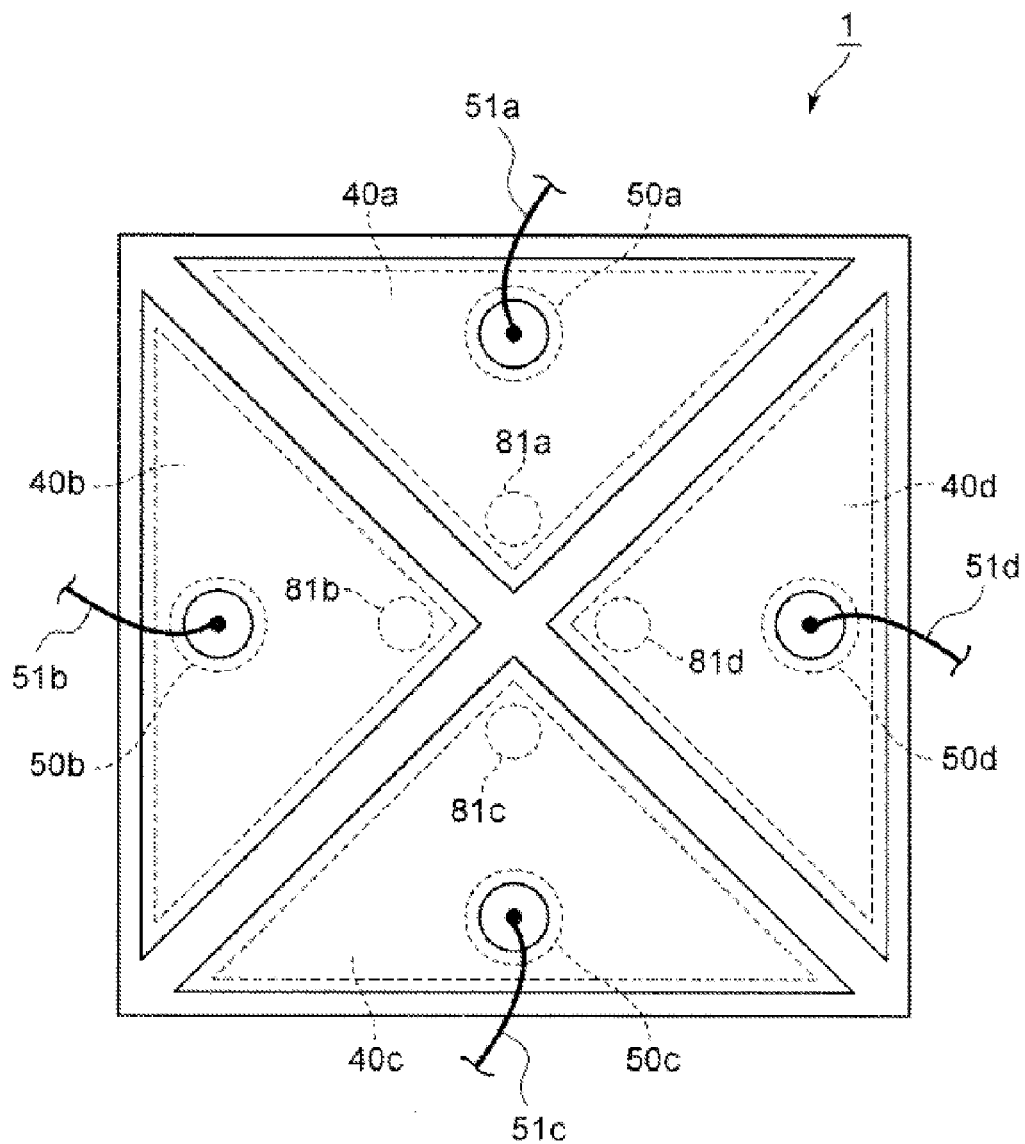
FIG. 3B is a schematic top view of a semiconductor light emitting element according to one embodiment.

The shape of each of the semiconductor regions 40a to 40h as viewed from the top surface thereof is preferably square (see FIG. 2), rectangular (for example, see FIG. 3A), or triangular (for example, see FIG. 3B). Such a shape enables equal cutting of the upper surface of the semiconductor light emitting element 1 to ensure the area of the semiconductor laminate 40 as widely as possible. Other shapes are possible. However, if each of the semiconductor regions 40a to 40h is hexagonal, for example, the upper surface of the semiconductor light emitting element 1 can be divided equally, but a semiconductor light emitting element having a rectangular shape cannot be obtained.

As shown in FIGS. 2, and 3A and 3B, n-side pads 50a to 50h for wire bonding are formed at the n-type semiconductor layer 41 of each of the semiconductor regions 40a to 40h. Each of the n-side pads 50a to 50h is preferably disposed adjacent to a side of each of the semiconductor regions 40a to 40h. Thus, when each of conductive wires 51a to 51h is installed from each of the n-side pads 50a to 50h to an external terminal (not shown), the conductive wire across each of the semiconductor regions 40a to 40h can be shortened. The amount of light shielded by the conductive wires 51a to 51h is decreased to enable improvement of the light extraction efficiency.

Preferably, at least one side of each of the semiconductor regions 40a to 40h is disposed to be adjacent to the outer periphery of the semiconductor light emitting element 1. Each of the n-side pads 50a to 50h is desirably disposed adjacent to any one of the sides of the regions adjacent to the outer periphery of the element 1. The conductive wires 51a to 51h connected to the semiconductor regions 40a to 40h do not cross over other semiconductor regions 40a to 40h. Thus, the amount of light shielded by the conductive wires 51a to 51h is further decreased, which can further improve the light extraction efficiency.

Figure 4A:
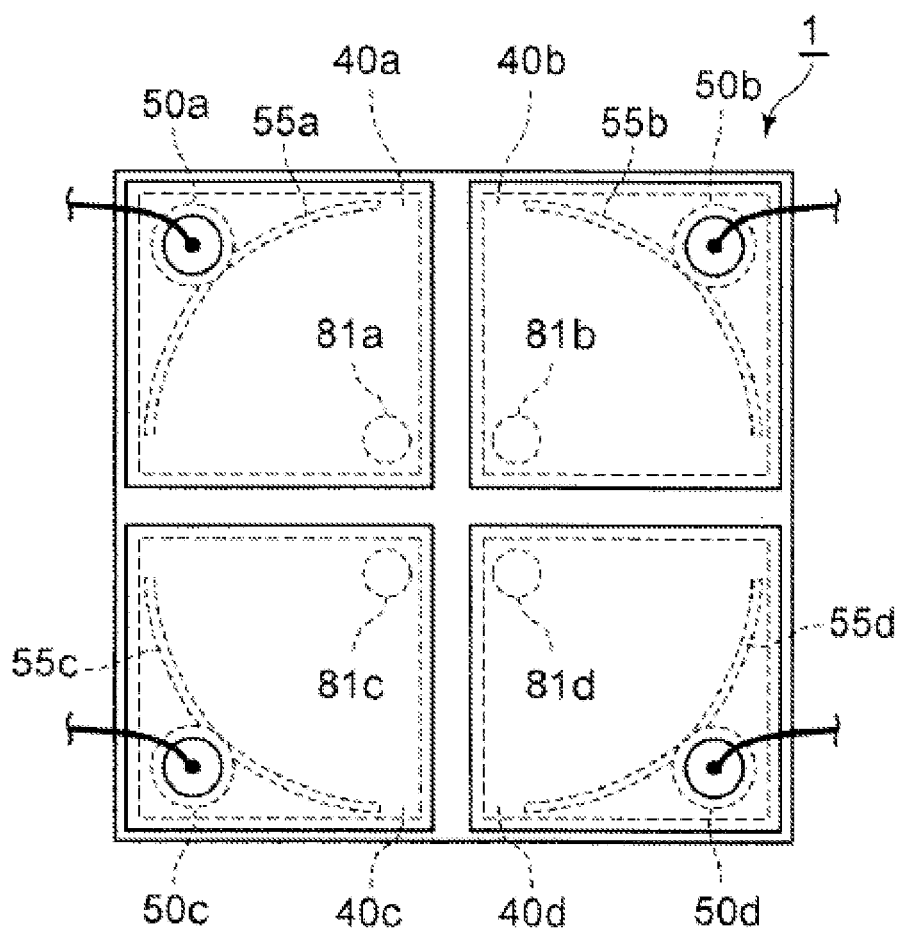
FIG. 4A is a schematic top view of a semiconductor light emitting element according to one embodiment.
Figure 4B:
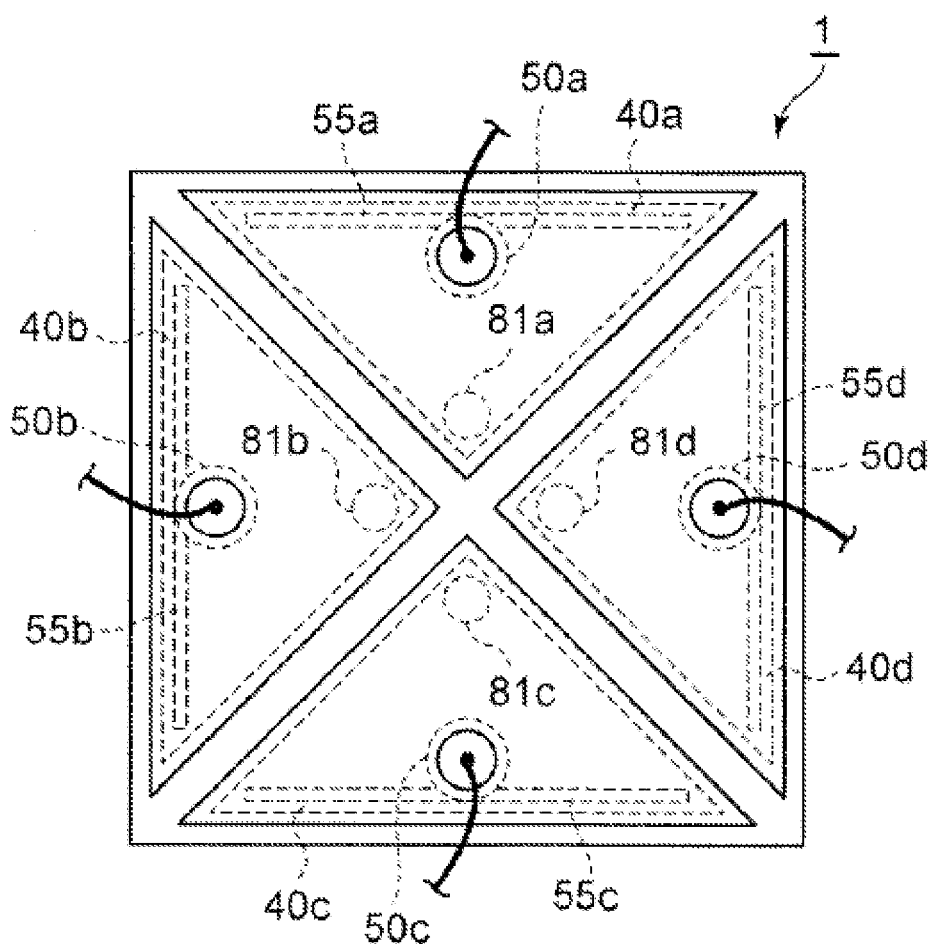
FIG. 4B is a schematic top view of a semiconductor light emitting element according to one embodiment.
Figure 4C:
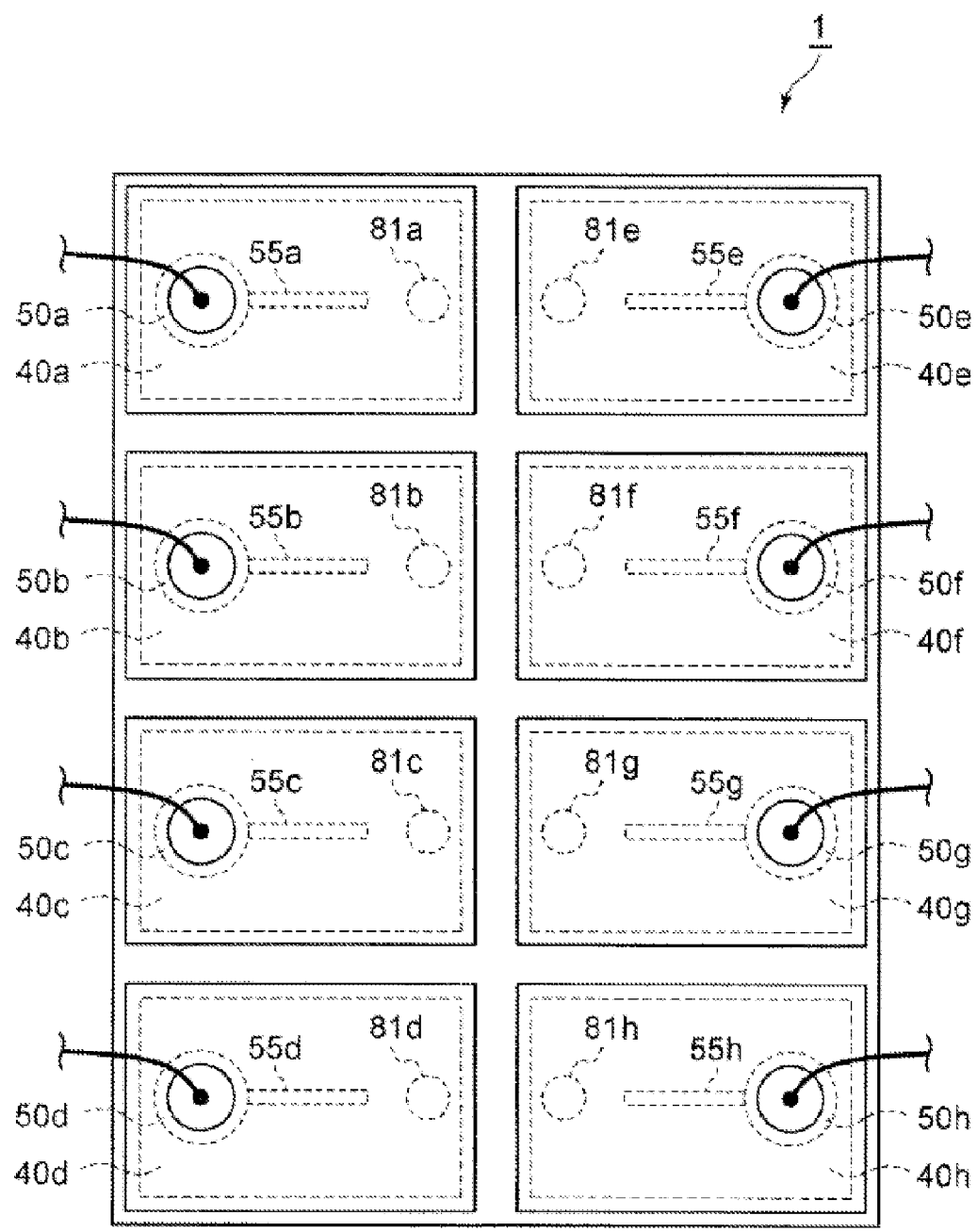
FIG. 4C is a schematic top view of a semiconductor light emitting element according to one embodiment.

Stretched electrodes 55 (55a to 55h) can be formed over the n-type semiconductor layer 41 to be electrically coupled to the n-side pads 50 so as to obtain ideal current spreading inside the semiconductor regions 40a to 40h (see FIGS. 4A to 4C). The semiconductor regions 40a to 40h are small as compared to the large-sized semiconductor light emitting element. Thus, the effects of short stretched electrode 55 in embodiments of the present invention are comparable to the effects of long stretched electrodes of a large-sized semiconductor light emitting element without trenches.

When the surface of n-type semiconductor layer 41 (that is, an upper surface of the semiconductor laminate 40) is subjected to roughing, the reflection of the light at the surface of the n-type semiconductor layer 41 can be beneficially suppressed. Advantages of this roughening include an increase in the amount of light emitted from the upper surface of the semiconductor laminate 40, and a decrease in the amount of light laterally transmitted through the semiconductor laminate 40 (that is, light reflected by the upper and lower surfaces of the semiconductor laminate 40), which enables reduction in the amount of light absorbed in the semiconductor laminate 40.

Now, a manufacturing method of the semiconductor light emitting element 1 shown in FIG. 2 will be described below with reference to FIGS. 5A to 5L.

Figure 5A:
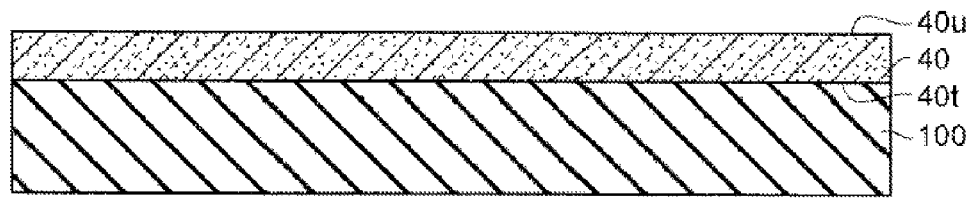
FIG. 5A is a schematic cross-sectional view for explaining a manufacturing method of the semiconductor light emitting element shown in FIG. 2.

(1) Growing Step (see FIG. 5A)

The n-type semiconductor layer 41, the active layer 42, and the p-type semiconductor layer 43 are grown over the growth substrate 100 in that order to form the semiconductor laminate 40. The substrate 100 for growing of the semiconductor is a substrate to be removed in the following step, and may be formed of sapphire having any one of a C surface, an R surface, and an A surface as a main surface. A substrate formed of a different material than sapphire may be used as the substrate 100 for growth of the semiconductor. For example, known materials on which nitride semiconductors are grown may be used, such as an insulating substrate like spinel (MgAl$_2$O$_4$), or an oxide substrate that is lattice-matched to SiC (containing 6H, 4H, and 3C), ZnS, ZnO, GaAs, and a nitride semiconductor.

Figure 5B:
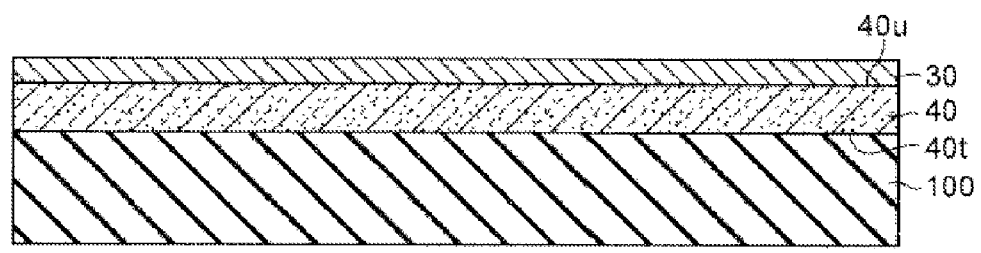
FIG. 5B is another schematic cross-sectional view for explaining the manufacturing method of the semiconductor light emitting element shown in FIG. 2.

(2) Reflection Layer Formation Step (see FIG. 5B)

The reflection layer 30 is formed over a surface 40u of the semiconductor laminate 40 on a p-type semiconductor layer side (p-type semiconductor layer side surface). The reflection layer 30 is preferably formed of a metal film (Ag film, Al film, or the like), for example, by magnetron sputtering.

Figure 5C:
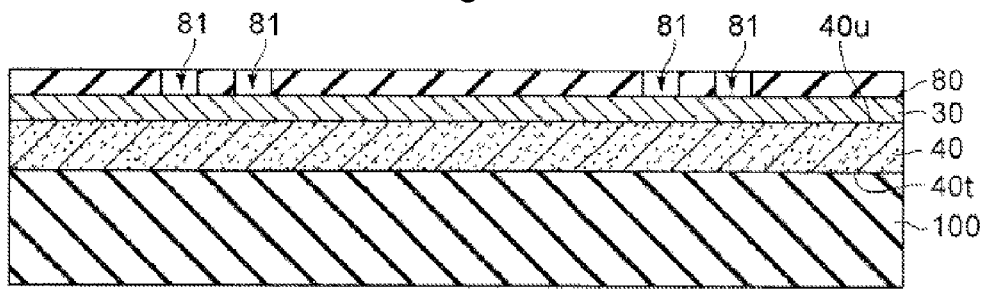
FIG. 5C is another schematic cross-sectional view for explaining the manufacturing method of the semiconductor light emitting element shown in FIG. 2.

(3) Protective Film Formation Method (see FIG. 5C)

The insulating protective film 80 is formed over the surface of the reflection layer 30. The protective film 80 is preferably formed of a dielectric single layer film or a dielectric multi-layered film.

The protective film 80 can be formed by known methods, such as a sputtering method, an electron cyclotron resonance (ECR) sputtering method, a chemical vapor deposition (CVD) method, an ECR-CVD method, an ECR-plasma CVD method, a vapor deposition method, an electron beam (EB) method, and the like. Among them, any one of the ECR sputtering method, the ECR-CVD method, and the ECR-plasma CVD method is preferably used.

Figure 5D:
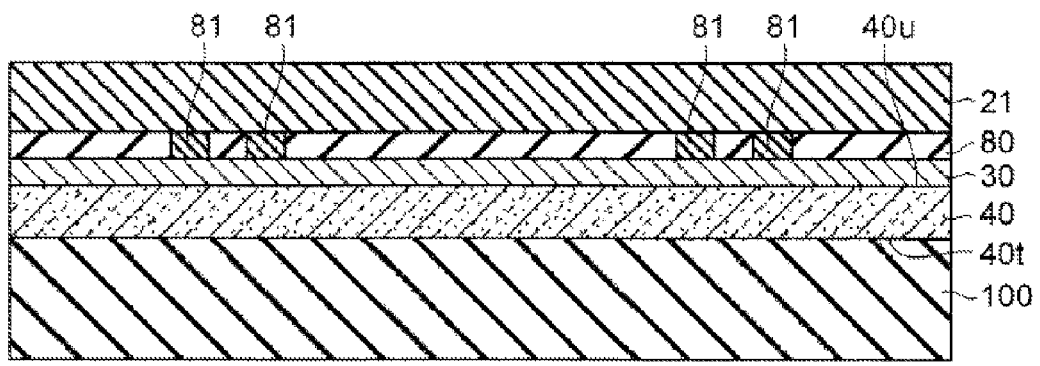
FIG. 5D is another schematic cross-sectional view for explaining the manufacturing method of the semiconductor light emitting element shown in FIG. 2.

(4) Formation Step of Semiconductor Side Junction Layer 21 (see FIG. 5D)

A semiconductor side junction layer 21 for bonding to the support substrate is formed over the protective film 80. A substrate side junction layer (not shown) is formed over the support substrate 10. Material from the junction layer may be deposited in the through hole 81.

Figure 5E:
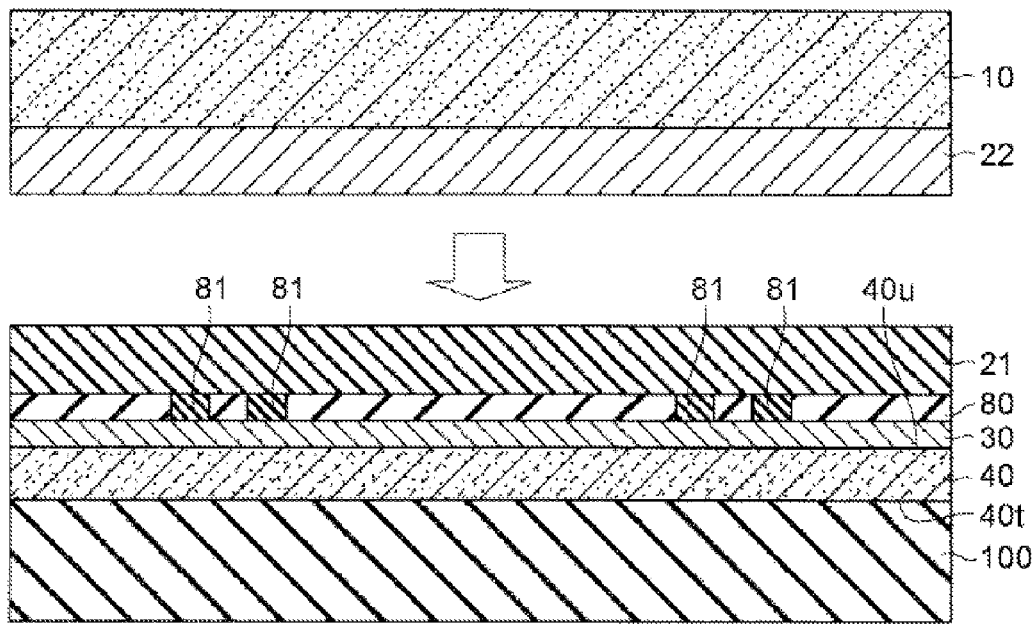
FIG. 5E is another schematic cross-sectional view for explaining the manufacturing method of the semiconductor light emitting element shown in FIG. 2.
Figure 5F:
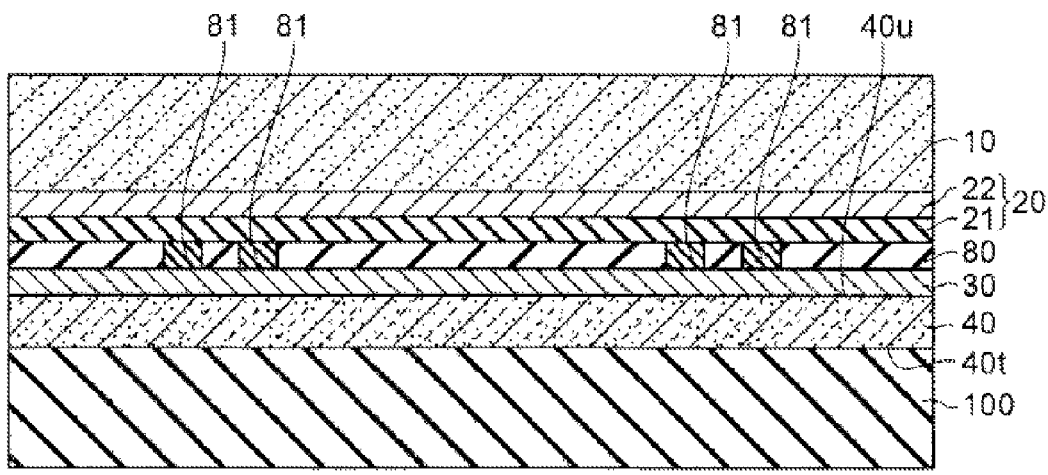
FIG. 5F is another schematic cross-sectional view for explaining the manufacturing method of the semiconductor light emitting element shown in FIG. 2.

(5) Joining Step (see FIGS. 5E to 5F)

A substrate side junction layer 22 of the support substrate 10 is opposed to the semiconductor side junction layer 21 (see FIG. 5E). By bonding the substrate side junction layer 22 to the semiconductor side junction layer 21, the p-type semiconductor layer 43 is joined to the support substrate 10 (see FIG. 5F). The substrate side junction layer 22 and the semiconductor side junction layer 21 are mixed into the junction layer 20.

In the joining step, the p-type semiconductor layer 43 is preferably joined to the support substrate 10 such that the extension direction of the trench 2 to be formed later is identical to the crystal orientation of the support substrate 10. Thus, in the following chip formation step, a division line is identical to the cleavage direction of the support substrate 10 when cutting the support substrate 10. This facilitates the division of the support substrate 10 to make the side of the divided support substrate 10 smooth.

Figure 5G:
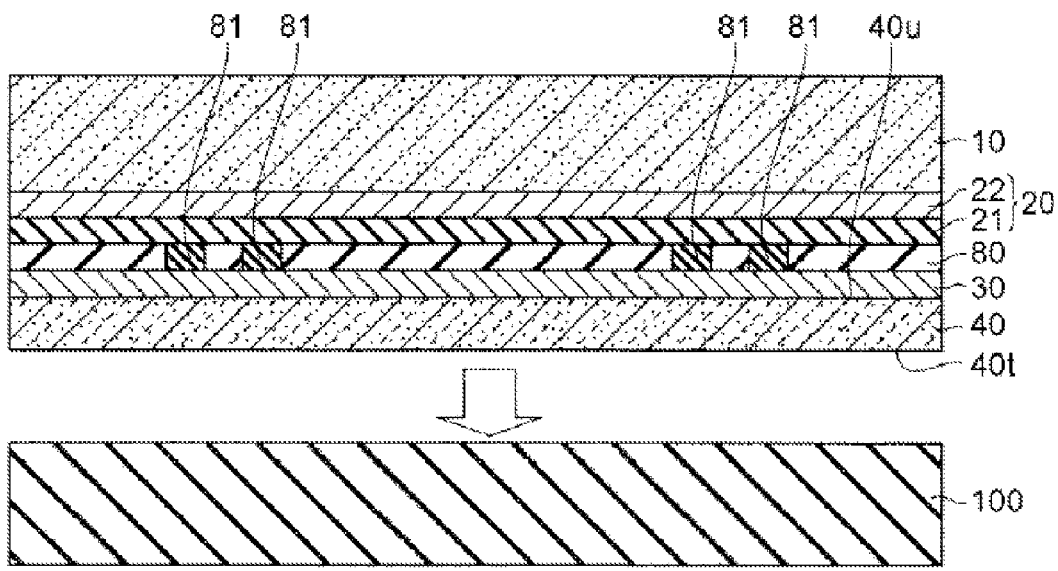
FIG. 5G is another schematic cross-sectional view for explaining the manufacturing method of the semiconductor light emitting element shown in FIG. 2.

(5) Growth Substrate Removal Step (see FIG. 5G)

After joining the support substrate 10, the growth substrate 100 is removed. Thus, a surface 40t of the semiconductor laminate 40 on an n-type semiconductor layer side is exposed.

Figure 5H:
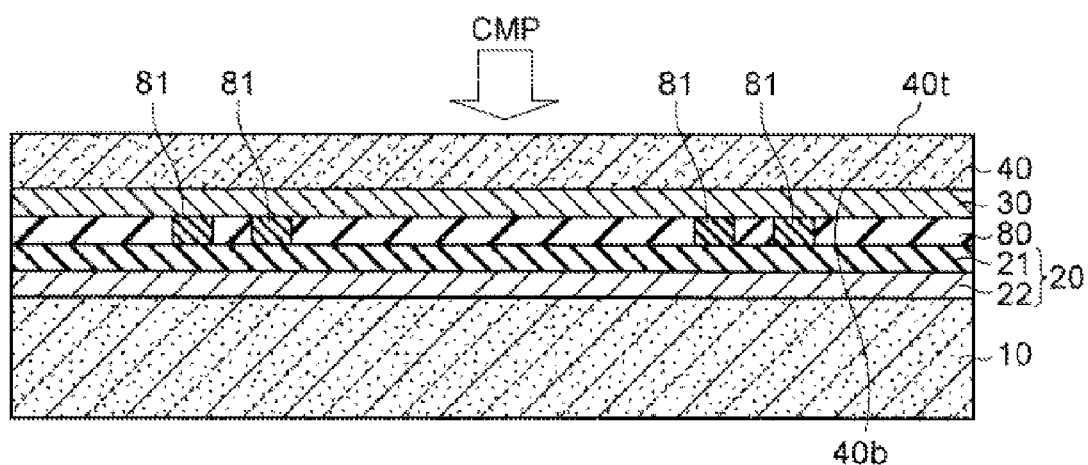
FIG. 5H is another schematic cross-sectional view for explaining the manufacturing method of the semiconductor light emitting element shown in FIG. 2.

(6) Polishing Step (see FIG. 5H)

After removing the substrate 100 for growth of the semiconductor, the support substrate 10 is turned upside down such that the support substrate 10 is positioned on the lower side. Then, the surface (n-side surface) 40t of the semiconductor laminate 40 as the uppermost surface over the n-type semiconductor layer side is polished by chemical mechanical polishing (CMP). In the polishing step by the CMP, the surface may be removed by reactive ion etching (RIE).

(7) Surface Roughening Step

A surface roughening step is performed by forming fine irregularities on the polished n-side surface 40t of the semiconductor laminate 40. The surface roughening can be performed using dry etching or wet etching.

Wet etching solutions used as an anisotropic etching solution can be, for example, an aqueous KOH solution, a tetramethylammonium hydroxide (TMAH), an ethylenediamine pyrocatechol (EDP), and the like.

In the case of dry etching, the reactive ion etching (RIE) can be used.

Figure 5I:
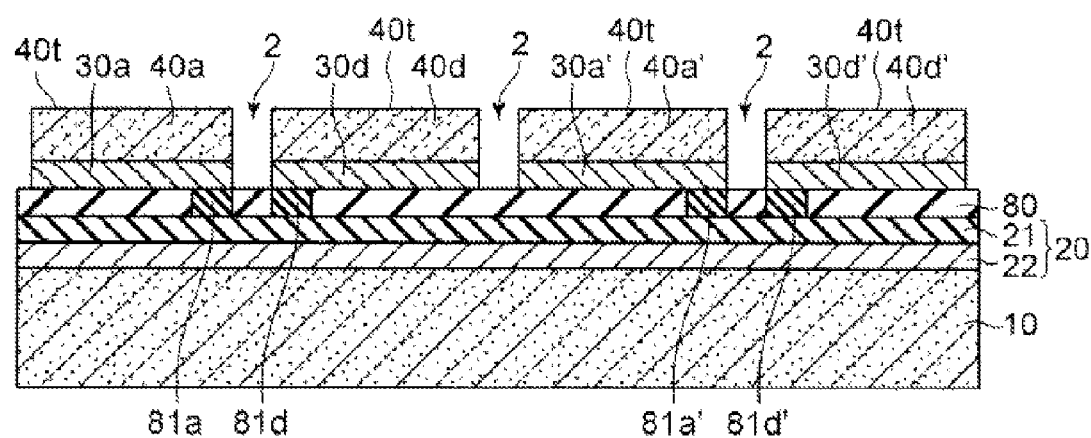
FIG. 5I is another schematic cross-sectional view for explaining the manufacturing method of the semiconductor light emitting element shown in FIG. 2.

(8) Region Dividing Step (see FIG. 5I)

The semiconductor laminate 40 is divided into a plurality of semiconductor regions 40a to 40d by the trenches 2. The trenches 2 with a small width can be accurately formed by the dry etching or wet etching.

A stress can develop in the semiconductor laminate 40 due to a difference in its thermal expansion coefficient from that of the support substrate 10. As a result, the semiconductor laminate 40 and the support substrate 10 can become warped (in which case the semiconductor laminate 40 side becomes convex). In the case of the large-sized semiconductor light emitting element, even after cutting the laminate into the elements, the element is still warped, which is problematic from the viewpoint of wire bonding or the like. In the present invention, however, the division of the semiconductor laminate 40 by the trenches 2 can relieve stress in the semiconductor laminate 40 to eliminate the warpage.

When forming the trenches 2 in the semiconductor laminate 40, a part of the reflection layer 30 formed between the semiconductor laminate 40 and the support substrate 10 can also be removed. Thus, the reflection layer 30 can be removed from the bottom 2b of the trench 2 at the same time as the formation of the trench 2. In the following "chip formation step," even when the semiconductor laminate is divided by any one of the trenches 2, the reflection layer 30 is not exposed at the outer periphery of the semiconductor light emitting element 1. This can suppress the migration of the reflection layer 30 of the semiconductor light emitting element 1.

Figure 5J:
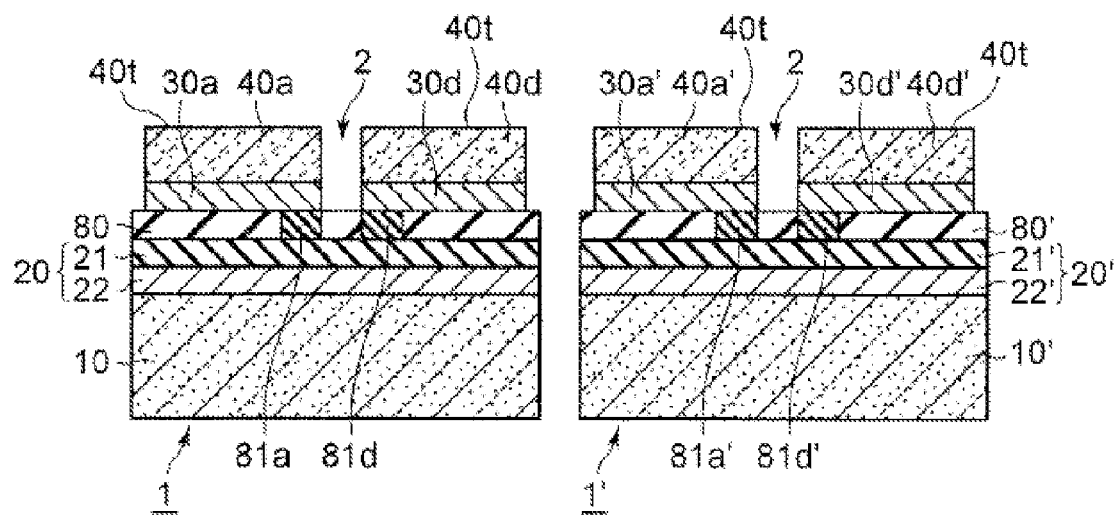
FIG. 5J is another schematic cross-sectional view for explaining the manufacturing method of the semiconductor light emitting element shown in FIG. 2.

(9) Chip Formation Step (see FIG. 5J)

The support substrate 10 is divided into a plurality of semiconductor light emitting elements 1 by the trenches 2. Each semiconductor light emitting element 1 contains at least two semiconductor regions (for example, four semiconductor regions 40a to 40d as shown in FIG. 1). The division can be performed by using scribe, dicing, laser scribe, or the like.

In the chip formation step, the semiconductor regions 40a to 40d are preferably formed into chips such that at least one side of each of the semiconductor regions 40a to 40d is at or near the outer periphery of the semiconductor light emitting element 1.

Figure 6:
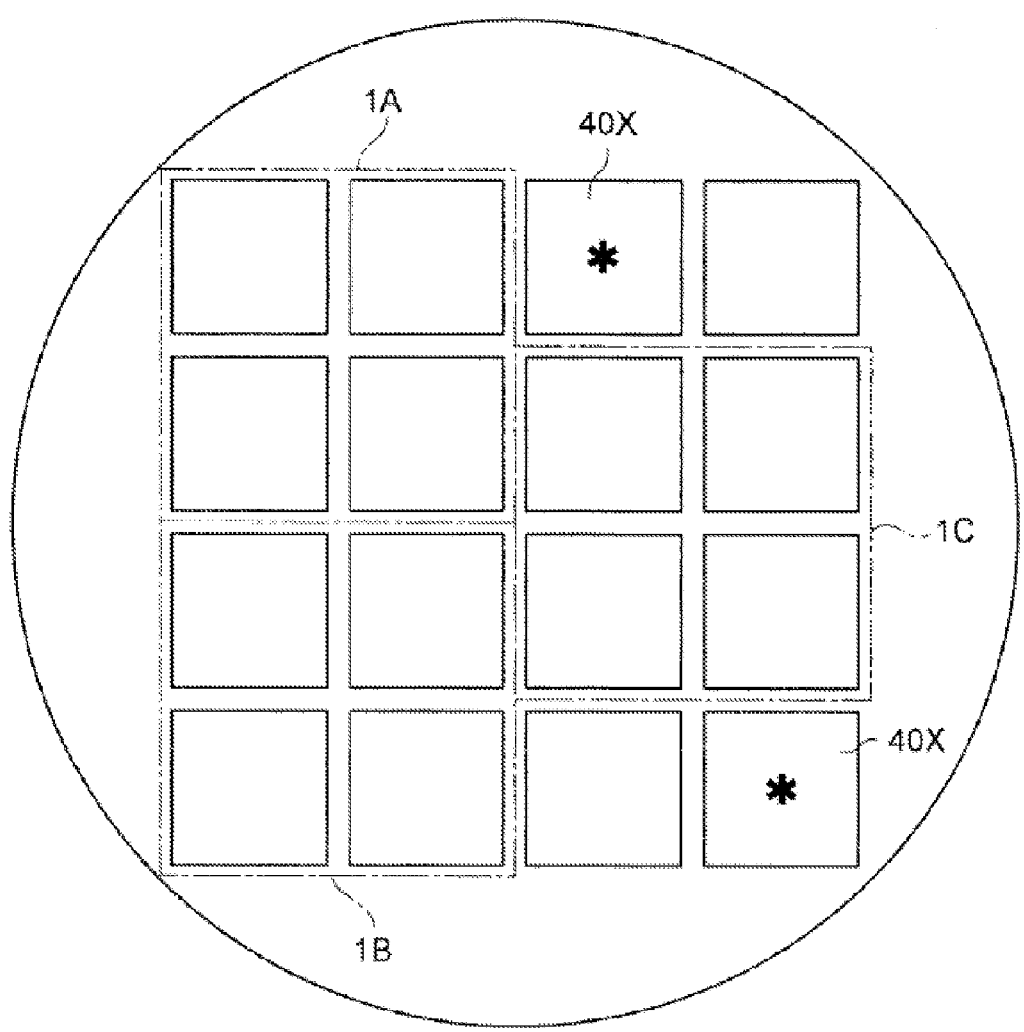
FIG. 6 is a schematic top view for explaining a chip formation step of the semiconductor light emitting element in the first embodiment.
Figure 7:
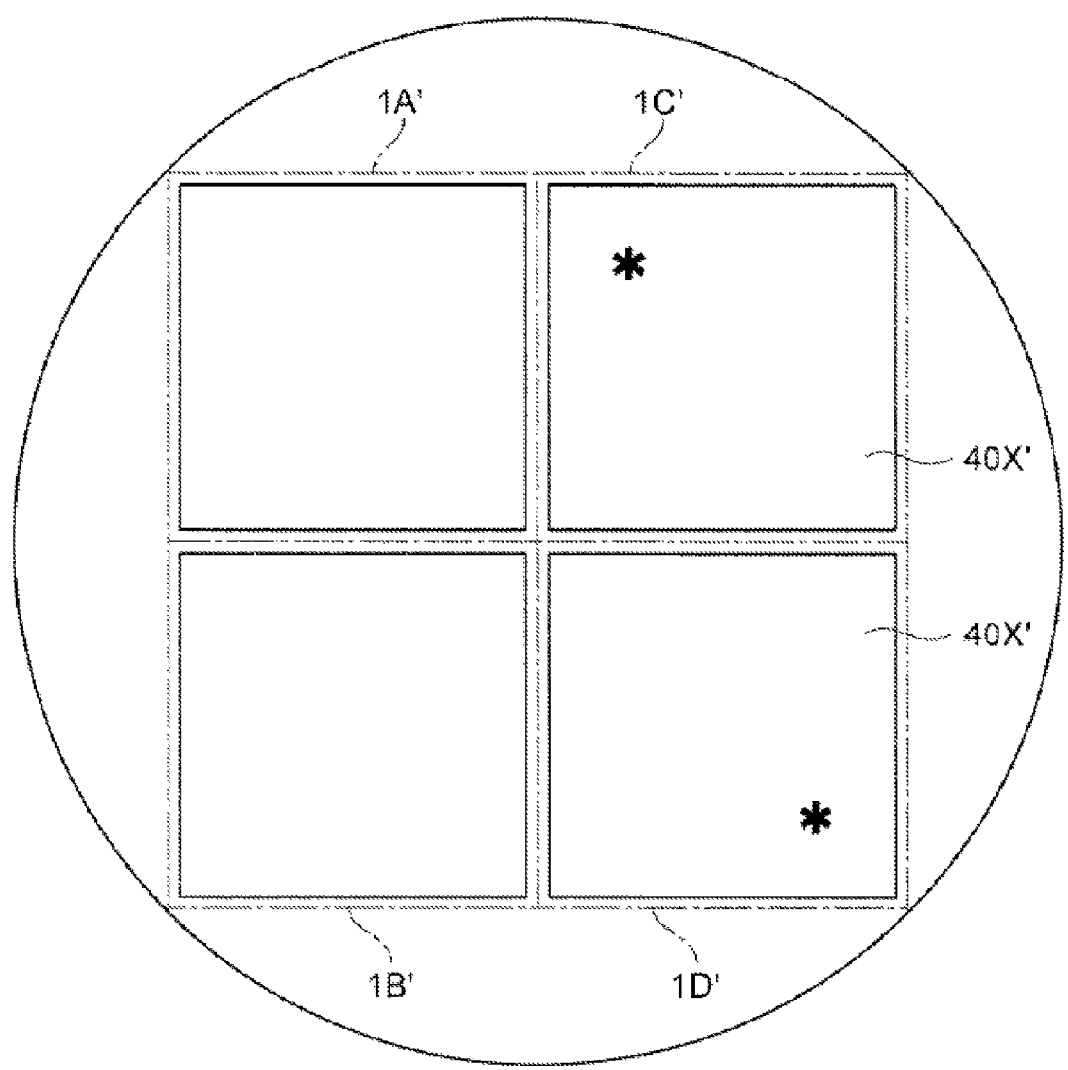
FIG. 7 is a schematic top view for explaining a chip formation step of a conventional large-sized semiconductor light emitting element.

In the chip formation step, the desired number of semiconductor regions 40a to 40d in the desired arrangement may be used. Thus, for example, as shown in FIG. 1, when four semiconductor regions are arranged in 2 rows×2 columns, defective semiconductor regions 40× are avoided, and thus three good semiconductor light emitting elements 1A to 1C can be obtained (see FIG. 6). In the case of the large-sized semiconductor light emitting element without any trenches 2, defective semiconductor regions cannot be avoided, whereby two semiconductor light emitting elements 1C' and 1D' are defective, and only two acceptable semiconductor light emitting elements 1A' and 1B' are obtained (see FIG. 7). That is, in the present invention, since the semiconductor light emitting element 1 is formed of the semiconductor regions 40a to 40d, defective regions can be avoided, which can improve the yield of the semiconductor light emitting elements 1.

Figure 5K:
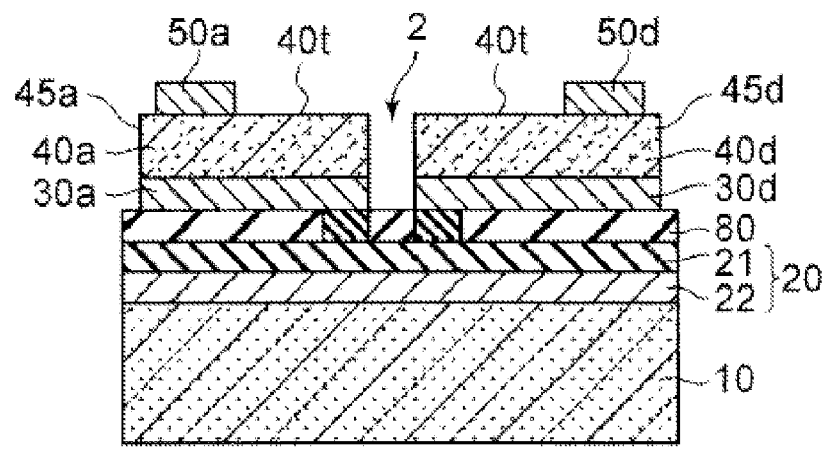
FIG. 5K is another schematic cross-sectional view for explaining the manufacturing method of the semiconductor light emitting element shown in FIG. 2.

(10) n-side Pad Formation Step (See FIG. 5k)

The n-side pad 50 is formed over the n-side surface 40t of each of the semiconductor regions 40a to 40d. The n-side pad 50 is preferably disposed adjacent to one side of each of the semiconductor regions 40a to 40d (see FIGS. 1 and 3A to 3B).

Figure 5L:
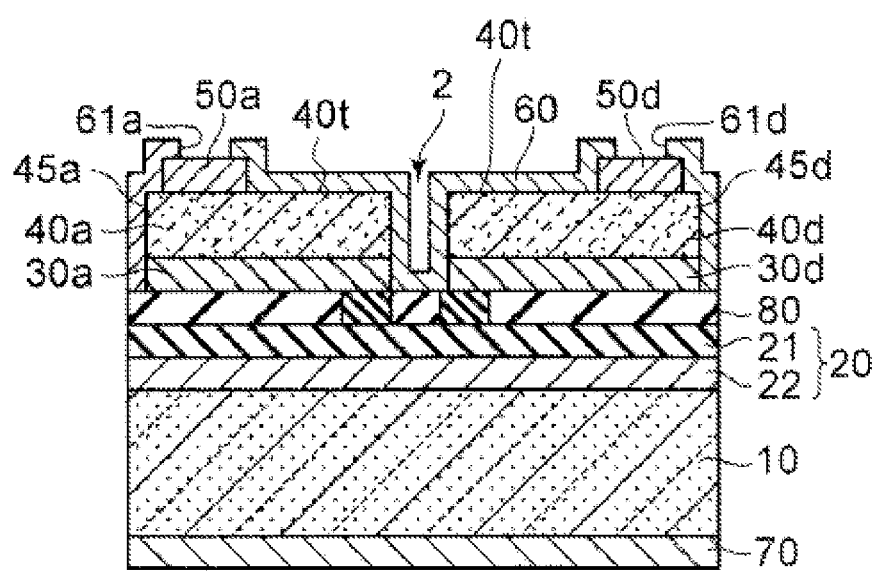
FIG. 5L is another schematic cross-sectional view for explaining the manufacturing method of the semiconductor light emitting element shown in FIG. 2.

(11) Outer Protective Film Formation Step (see FIG. 5L)

The n-side pad 50 except for one part of the surface of the pad 50 (region subjected to wire bonding), the upper surface 40t of the semiconductor laminate 40, the outer sides 45a to 45d, and the inner sides 46a to 46d each are covered with the protective film 60. The outer protective film 60 can be formed by known methods, such as a sputtering method, an electron cyclotron resonance (ECR) sputtering method, a chemical vapor deposition (CVD) method, an ECR-CVD method, an ECR-plasma CVD method, a vapor-deposition method, or an electron beam (EB) deposition method. Among them, the outer protective film 60 is preferably formed by the ECR sputtering method, the ECR-CVD method, the ECR-plasma CVD method, or the like.

(12) Backside Metallized Layer Formation Step

The backside metallized layer 70 is formed as an ohmic electrode over the back side of the support substrate 10.

The obtained semiconductor element 1 is mounted by die-bonding the backside metallized layer 70 and connecting the conductive wire 51 to the n-side pad 50.

Second Embodiment

Figure 8:
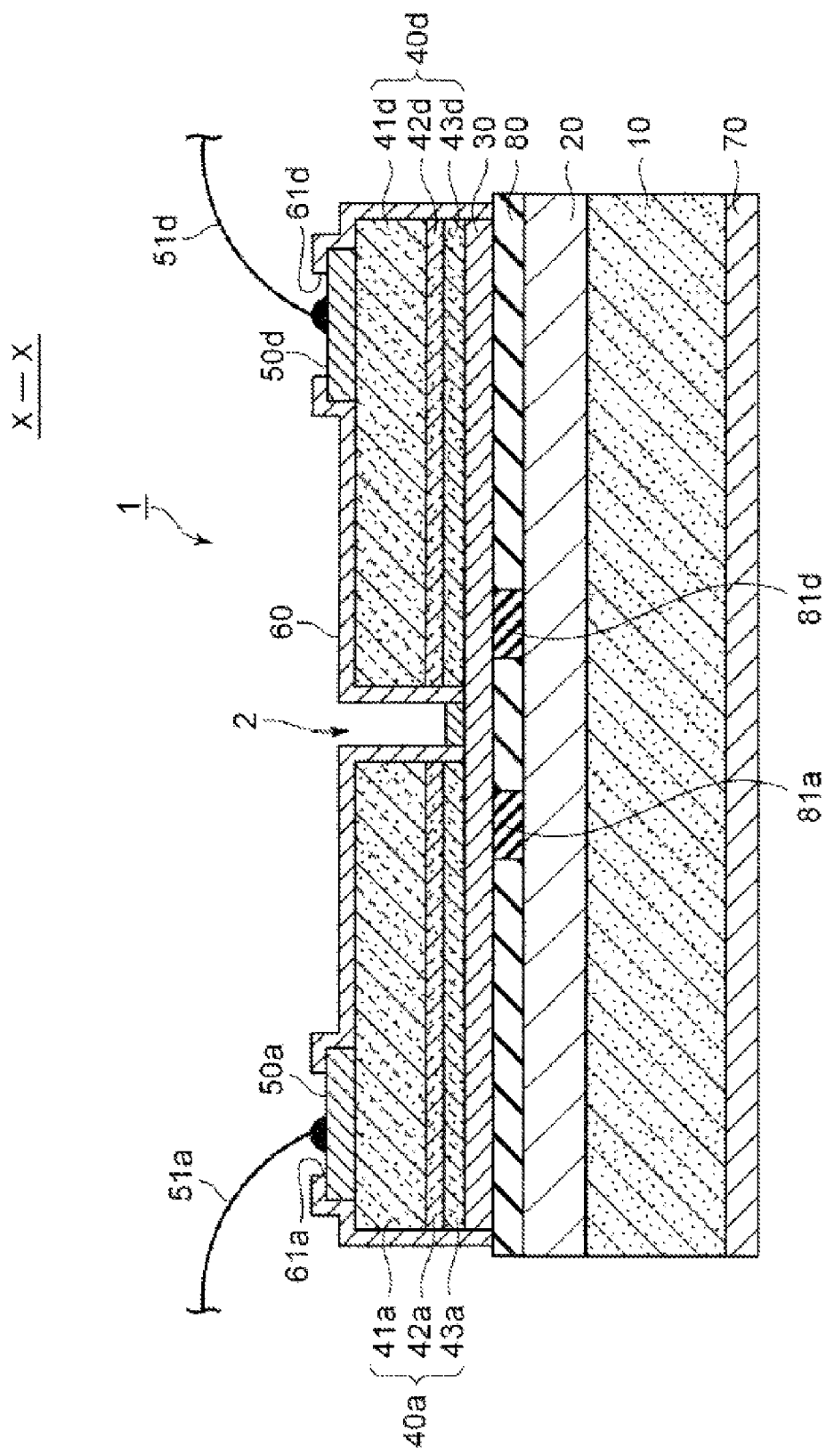
FIG. 8 is a schematic cross-sectional view of a semiconductor light emitting element according to a second embodiment, taken along the line X-X as shown in FIG. 1.

The present embodiment differs from the first embodiment in that the reflection layer 30 is formed up to the bottom 2b of the trench 2 (see FIG. 8). When the reflection 30 is formed of material or the like that is unlikely to migrate, the present modified embodiment is preferable. The reflection layer 30 whose reflectivity is generally higher than that of a dielectric multilayered film allows the light directed toward the bottom 2b of the trench 2 to be effectively reflected and emitted toward the outside of the trench 2. Thus, the formation of the reflection layer 30 up to the bottom 2b of the trench 2 can further improve the light extraction efficiency of the semiconductor light emitting element 1.

When manufacturing the semiconductor light emitting element 1 of the present embodiment, "(8) region separation step (see FIG. 5I)" of the manufacturing method disclosed in the first embodiment is modified. Specifically, when the trench 2 is formed in the semiconductor laminate 40, the reflection layer 30 formed between the semiconductor laminate 40 and the support substrate 10 is not removed, so that the reflection layer 30 can remain at the bottom 2b of the trench 2. Other steps of the present embodiment are the same as those of the first embodiment.

Third Embodiment

Figure 9:
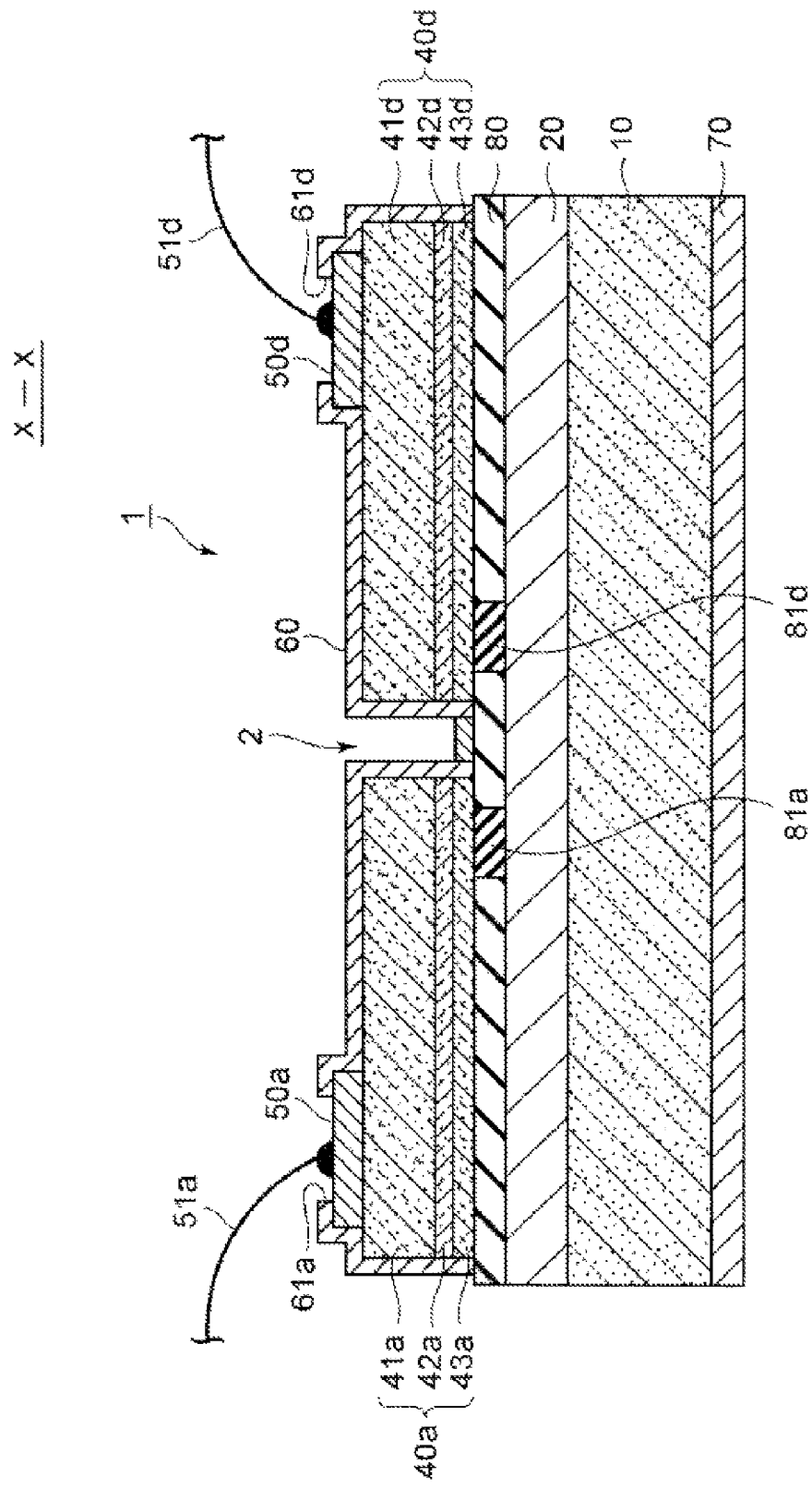
FIG. 9 is a schematic cross-sectional view of a semiconductor light emitting element according to a third embodiment, taken along the line X-X as shown in FIG. 1.

The present embodiment differs from the first embodiment in that only the protective film 80 is provided between the support substrate and the semiconductor laminate without providing the reflection layer 30 (see FIG. 9). In the same manner as in the first embodiment, the protective film 80 can also be provided at the bottom 2b of the trench 2. When the material for the reflection layer 30 is likely to migrate, or when the reflection layer 30 is disadvantageously likely to diffuse into the semiconductor laminate 40, the reflection layer 30 is preferably not formed. The formation of the protective film 80 using a dielectric multilayered film instead of the reflection layer 30 permits the light to be reflected from the semiconductor laminate 40 toward the support substrate 10 and thus can suppress the absorption of the light. The inclusion of the protective film 80 formed of the dielectric multilayered film can keep the intensity of light transmitted through the semiconductor laminate 40 high to thereby improve the light extraction efficiency.

When manufacturing the semiconductor light emitting element 1 of the present embodiment, the "(2) reflection layer formation step (see FIG. 5B)" of the manufacturing method described in the first embodiment is not performed. Further, in the "(3) protective film formation step (see FIG. 5C)", the protective film 80 is formed of a dielectric multilayered film. Other steps of the present embodiment are the same as those of the first embodiment.

Fourth Embodiment

The present embodiment forms a semiconductor light emitting element 1 in a different manufacturing method from that of the first embodiment. The thus-obtained semiconductor light emitting element 1 differs from the semiconductor light emitting element 1 of the first to third embodiments in that the protective film 80 and the reflection layer 30 are not formed at the bottom 2b of the trench 2.

A manufacturing method of the present embodiment will be described below.

Figure 10A:
FIG. 10A is a schematic cross-sectional view for explaining a manufacturing method of a semiconductor light emitting element according to a fourth embodiment.

(1) Growing Step (see FIG. 10A)

In the same manner as in the first embodiment, the n-type semiconductor layer 41, the active layer 42, and the p-type semiconductor layer 43 are sequentially grown over the growth substrate 100 in that order to form the semiconductor laminate 40.

Figure 10B:
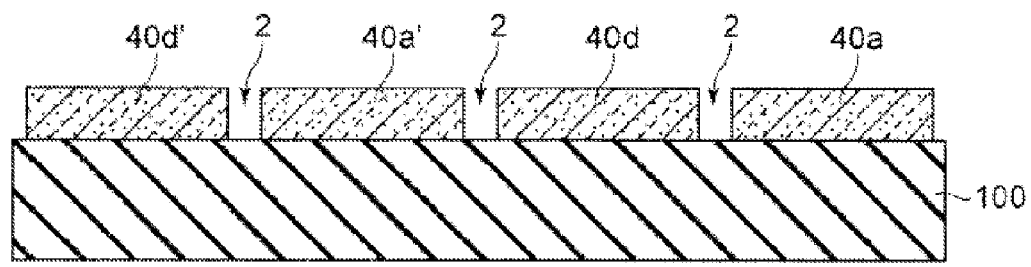
FIG. 10B is another schematic cross-sectional view for explaining the manufacturing method of the semiconductor light emitting element in the fourth embodiment.

(1') Region Dividing Step (see FIG. 10B)

In the same manner as in the first embodiment, the region dividing step is performed next to the growing step of the semiconductor laminate 40.

The details of the region dividing step are the same as those of the first embodiment. That is, in the region dividing step, the semiconductor laminate 40 is divided into the semiconductor regions 40a to 40d by the trenches 2. The use of dry etching or wet etching can accurately form the trenches 2 with the small width. The division of the semiconductor laminate 40 by the trenches 2 can relieve the stress inside the semiconductor laminate 40 to eliminate the warpage of the laminate, as in the first embodiment.

Figure 10C:
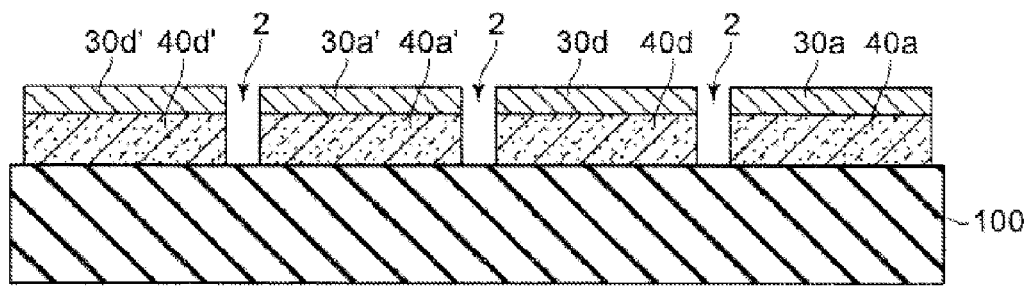
FIG. 10C is another schematic cross-sectional view for explaining the manufacturing method of the semiconductor light emitting element in the fourth embodiment.
Figure 10D:
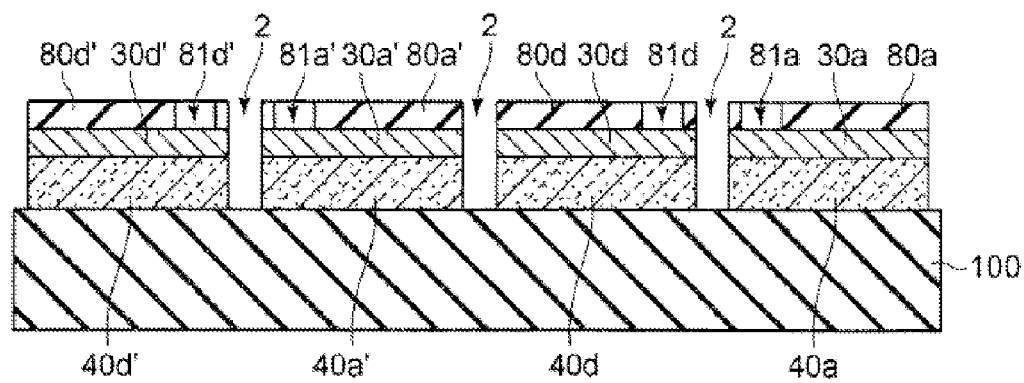
FIG. 10D is another schematic cross-sectional view for explaining the manufacturing method of the semiconductor light emitting element in the fourth embodiment.
Figure 10E:
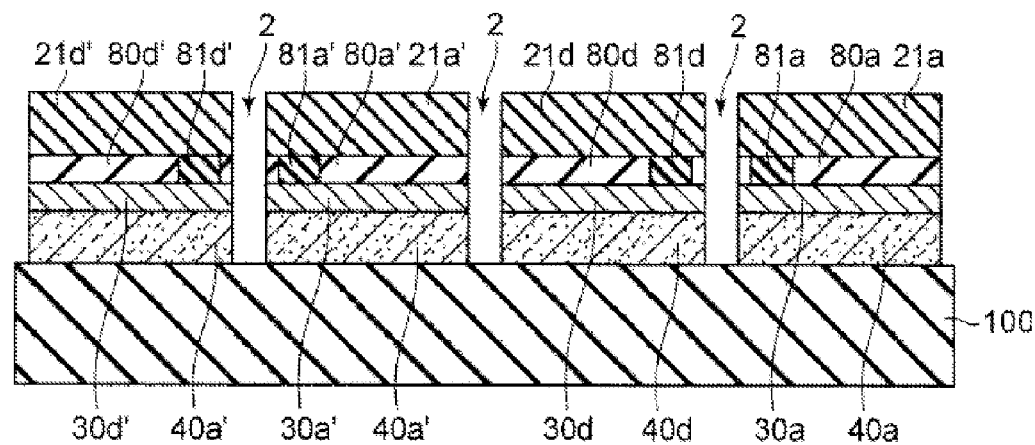
FIG. 10E is another schematic cross-sectional view for explaining the manufacturing method of the semiconductor light emitting element in the fourth embodiment.

(2) Reflection Layer Formation Step (see FIG. 10C), (3) Protective Film Formation Step (see FIG. 10D), and (4) Formation Step of Semiconductor Side Junction Layer 21 (see FIG. 10E)

These steps are substantially the same as those of the first embodiment. In the present embodiment, however, the semiconductor laminate 40 is divided by the trenches 2 in advance. Thus, the present embodiment differs from the first embodiment in that the reflection layer 30, the protection layer 80, and the semiconductor side junction layer 21 are formed while being divided by the trenches 2.

Figure 10F:
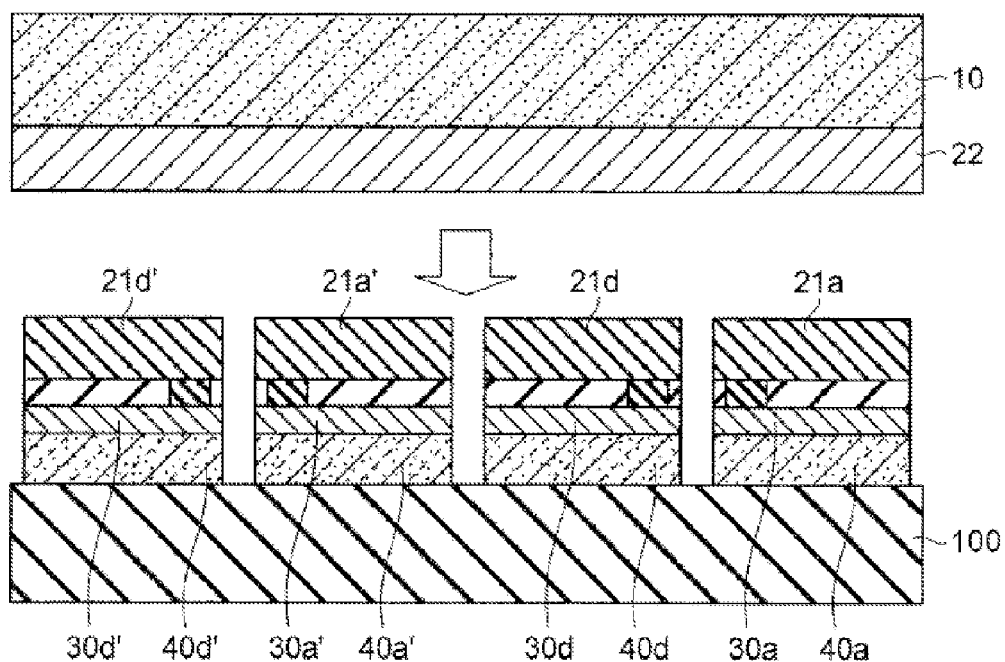
FIG. 10F is another schematic cross-sectional view for explaining the manufacturing method of the semiconductor light emitting element in the fourth embodiment.
Figure 10G:
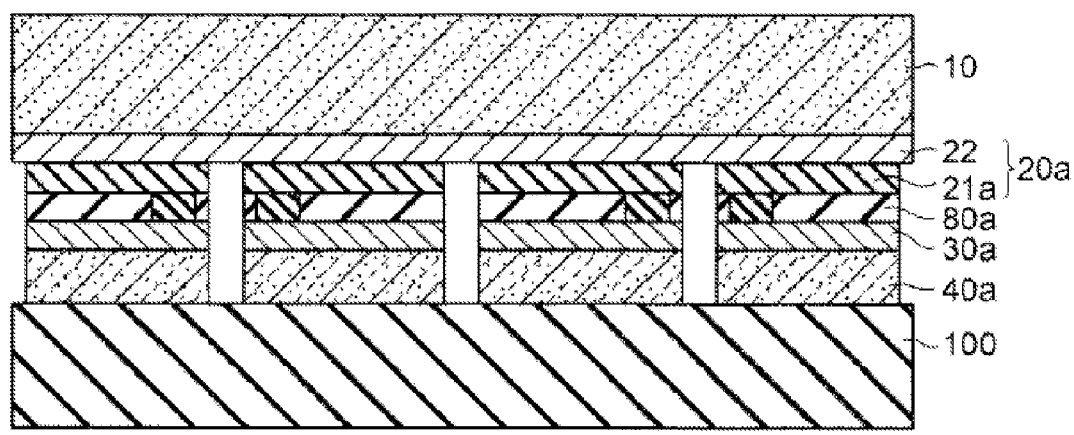
FIG. 10G is another schematic cross-sectional view for explaining the manufacturing method of the semiconductor light emitting element in the fourth embodiment.

(5) Joining Step (see FIGS. 10F and 10G)

These steps are substantially the same as those of the first embodiment. The semiconductor side junction layer 21 is divided by the trenches 2. Thus, the present embodiment differs from the first embodiment in that the semiconductor laminate 40 is joined to the support substrate 10 only in regions other than the trenches 2.

Figure 10H:
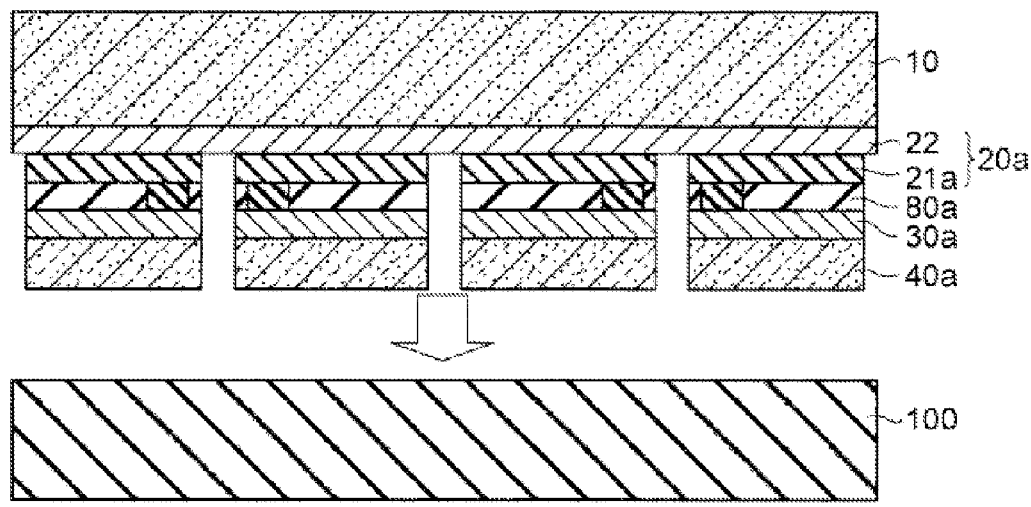
FIG. 10H is another schematic cross-sectional view for explaining the manufacturing method of the semiconductor light emitting element in the fourth embodiment.
Figure 10I:
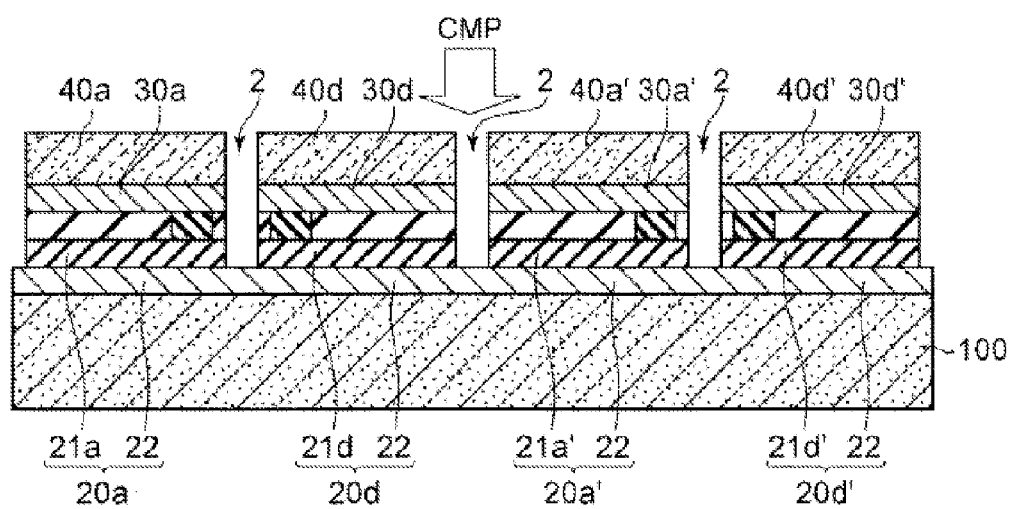
FIG. 10I is another schematic cross-sectional view for explaining the manufacturing method of the semiconductor light emitting element in the fourth embodiment.

(5) Growth Substrate Removal Step (see FIG. 10H), (6) Polishing Step (see FIG. 10I), and (7) Surface Roughening Step These steps are substantially the same as those of the first embodiment.

Figure 10J:
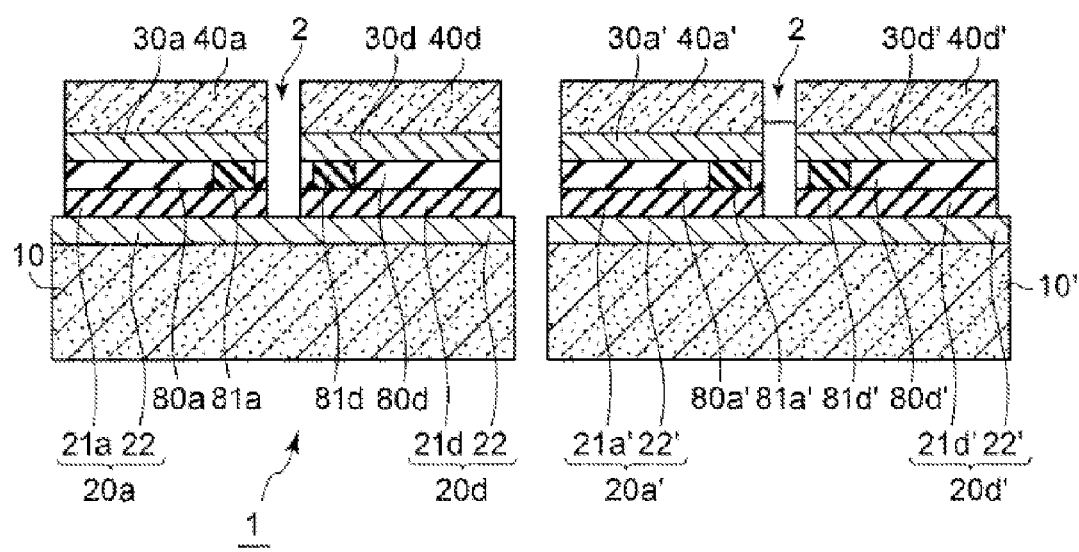
FIG. 10J is another schematic cross-sectional view for explaining the manufacturing method of the semiconductor light emitting element in the fourth embodiment.

(9) Chip Formation Step (see FIG. 10J)

The present embodiment includes the "(1') region dividing step", and thus does not include the "(8) region dividing step" of the first embodiment. Thus, the chip formation step is performed next to the "(7) surface roughening step".

Other points of the present embodiment are the same as those of the first embodiment.

(10) n-side Pad Formation Step (see FIG. 5K), (11) Outer Protective Film Formation Step (see FIG. 5L), (12) Backside Metallized Layer Formation Step These steps are substantially the same as those of the first embodiment.

When the semiconductor light emitting element is manufactured by the manufacturing method of the present embodiment, the stress inside the semiconductor laminate 40 can be reduced before joining to the support substrate 10, thus resulting in highly effective stress relief in the semiconductor light emitting element 1 after the joining.

Fifth Embodiment

The present embodiment differs from the fourth embodiment in the order of the steps (1) and (2). The steps (3) to (12) of the present embodiment are the same as those of the fourth embodiment.

In the following, the different points from the fourth embodiment will be described.

Figure 11A:
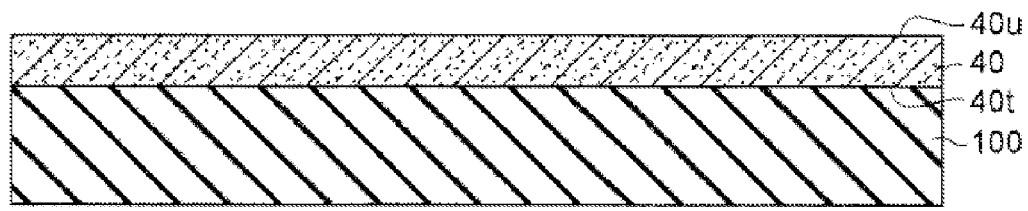
FIG. 11A is a schematic cross-sectional view for explaining a manufacturing method of a semiconductor light emitting element according to a fifth embodiment.

(1) Growing Step (see FIG. 11A)

In the same manner as in the first and fourth embodiments, the n-type semiconductor layer 41, the active layer 42, and the p-type semiconductor layer 43 are sequentially grown over the growth substrate 100 in that order to form the semiconductor laminate 40.

Figure 11B:
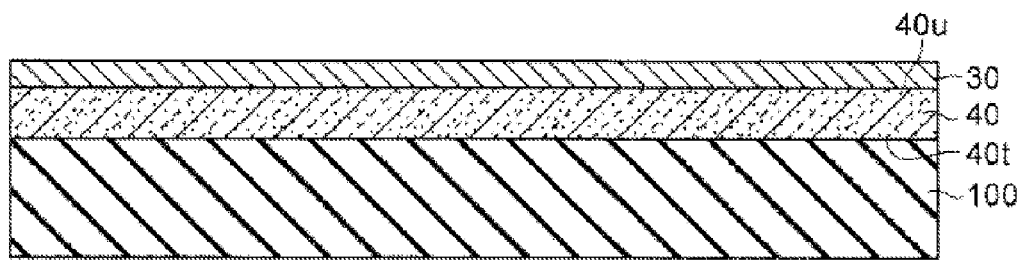
FIG. 11B is another schematic cross-sectional view for explaining the manufacturing method of the semiconductor light emitting element in the fifth embodiment.

(2) Reflection Layer Formation Step (see FIG. 11B)

This step is the same as that of the first embodiment.

Figure 11C:
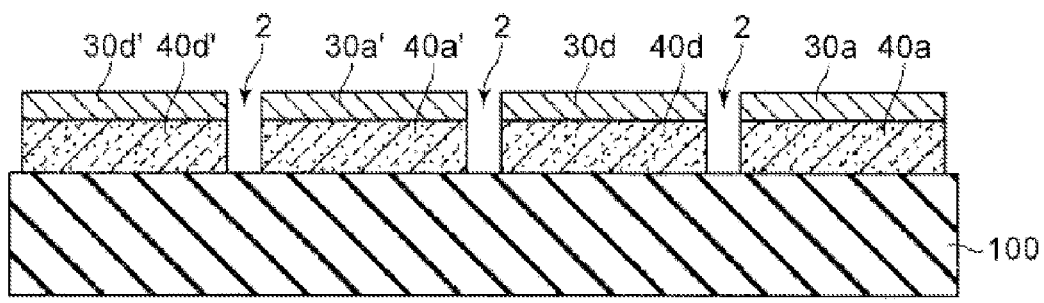
FIG. 11C is another schematic cross-sectional view for explaining the manufacturing method of the semiconductor light emitting element in the fifth embodiment.

(2') Region Dividing Step (see FIG. 11C)

After the reflection layer formation step, the region dividing step is performed.

The details of the region dividing step are the same as those of the first and fourth embodiment. That is, in the region dividing step, the semiconductor laminate 40 is divided into the semiconductor regions 40a to 40d by the trenches 2. The use of dry etching or wet etching can accurately form the trenches 2 with a small width. The division of the semiconductor laminate 40 by the trenches 2 can relieve the stress inside the semiconductor laminate 40 to eliminate warpage, as in the first embodiment.

When the semiconductor light emitting element is manufactured by the manufacturing method of the present embodiment, in the same manner as in the fourth embodiment, the stress inside the semiconductor laminate 40 can be reduced before joining to the support substrate 10, thus resulting in highly effective stress relief in the semiconductor light emitting element 1 after the joining.

Sixth Embodiment

The present embodiment differs from the fourth embodiment in the order of the steps (1) to (3). The steps (4) to (12) of the present embodiment are the same as those of the fourth embodiment. In the following, different points from the fourth embodiment will be described.

Figure 12A:
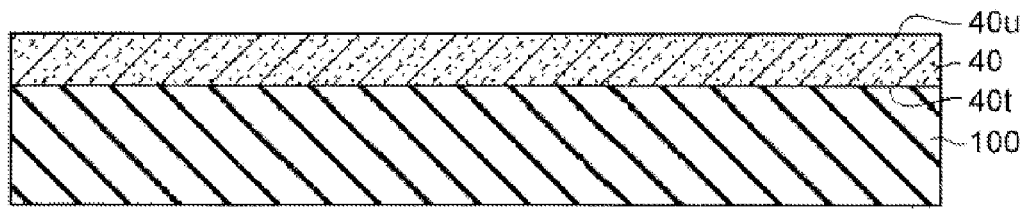
FIG. 12A is a schematic cross-sectional view for explaining a manufacturing method of a semiconductor light emitting element according to a sixth embodiment.

(1) Growing Step (see FIG. 12A)

In the same manner as in the first, fourth, and fifth embodiments, the n-type semiconductor layer 41, the active layer 42, and the p-type semiconductor layer 43 are sequentially grown over the growth substrate 100 in that order to form the semiconductor laminate 40.

Figure 12B:
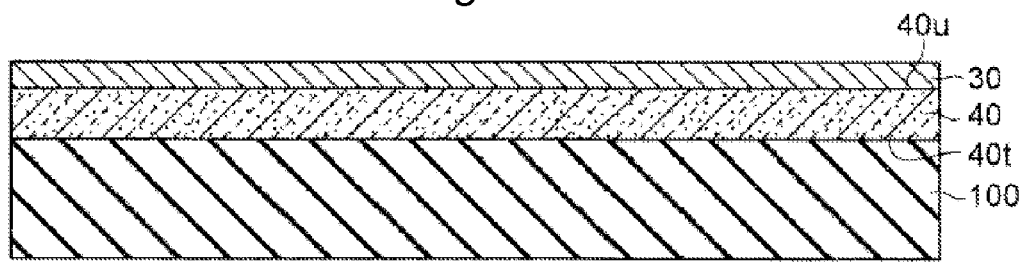
FIG. 12B is another schematic cross-sectional view for explaining the manufacturing method of the semiconductor light emitting element in the sixth embodiment.

(2) Reflection Layer Formation Step (see FIG. 12B)

This step is the same as that in the first and fifth embodiments.

Figure 12C:
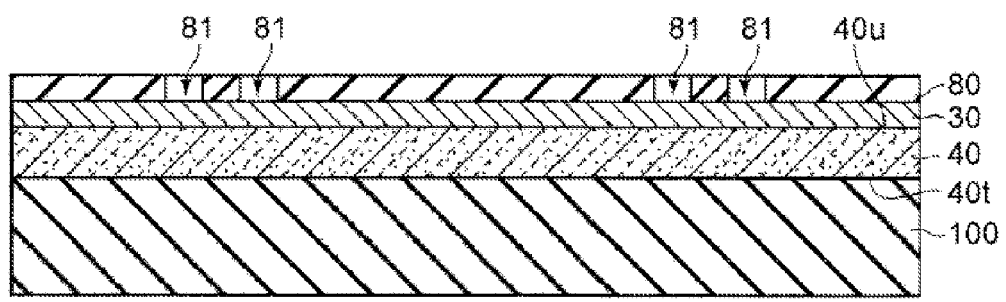
FIG. 12C is another schematic cross-sectional view for explaining the manufacturing method of the semiconductor light emitting element in the sixth embodiment.

(3) Protective Film Formation Step (see FIG. 12C)

This step is the same as that of the first embodiment.

Figure 12D:
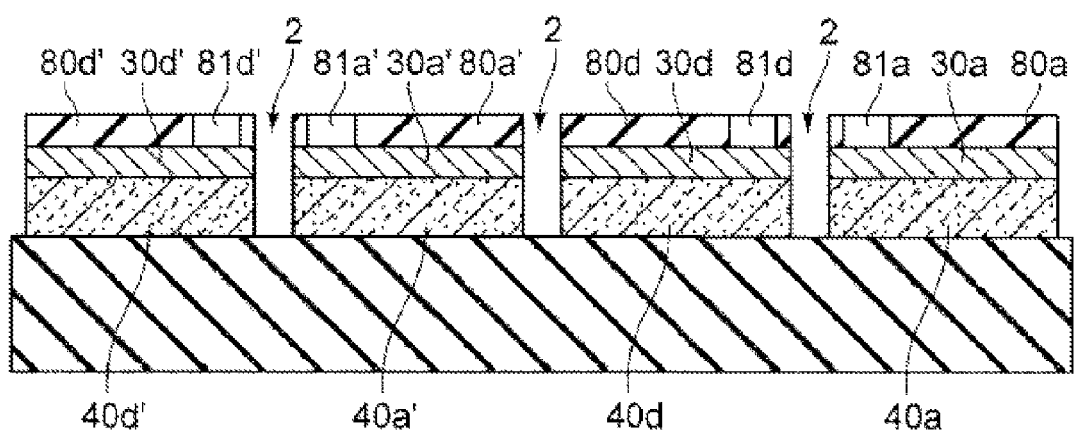
FIG. 12D is another schematic cross-sectional view for explaining the manufacturing method of the semiconductor light emitting element in the sixth embodiment.

(3') Region Dividing Step (see FIG. 12D)

The region dividing step is performed next to the protective film formation step.

The details of the region dividing step are the same as those in the first, fourth, and fifth embodiments. That is, in the region dividing step, the semiconductor laminate 40 is divided into the semiconductor regions 40a to 40d by the trenches 2. The use of dry etching or wet etching can accurately form the trenches 2 with the narrow width. The division of the semiconductor laminate 40 by the trenches 2 can relieve the stress inside the semiconductor laminate 40 to eliminate the warpage, as in the first embodiment.

When the semiconductor light emitting element is manufactured by the manufacturing method of the present embodiment, in the same manner as in the fourth and fifth embodiments, the stress inside the semiconductor laminate 40 can be reduced before joining to the support substrate 10, thus resulting in highly effective stress relief in the semiconductor light emitting element 1 after the joining.

Seventh Embodiment

The present embodiment differs from the fourth embodiment in that in the growing step (1), the p-type semiconductor layer, the active layer, and the n-type semiconductor layer are grown while being divided to thereby obtain a plurality of semiconductor regions. That is, in the present embodiment, the semiconductor regions shown in FIG. 10B are obtained in the growing step. The present embodiment does not include the "(1') Region Dividing Step" of the fourth embodiment.

The steps (2) to (12) are the same as those of the fourth embodiment.

When the semiconductor light emitting element is manufactured by the manufacturing method of the present embodiment, in the same manner as in the fourth embodiment, the stress inside the semiconductor laminate 40 can be reduced before joining to the support substrate 10, thus resulting in highly effective stress relief in the semiconductor light emitting element 1 after the joining.

The present embodiment can omit the region dividing step, and thus can decrease the number of steps.

Example 1

Suitable materials for the semiconductor light emitting device 90 of the present invention will be described in detail below.

Substrate 10

The substrate 10 may be formed of silicon (Si). The substrate 10 may be formed using not only Si but also a semiconductor substrate formed of a semiconductor, such as Ge, SiC, GaN, GaAs, GaP, InP, ZnSe, ZnS, or SnO, a single metal substrate, or a metal substrate formed of a metal complex of two or more kinds of metals which are not solid-soluble to each other or have a small solid solubility limit. Among them, specifically, Cu can be used as suitable material for the single metal substrate. The material for the metal substrate can be formed using one or more kinds of metals selected from the group of high-conductivity metals consisting of Ag, Cu, Au, and Pt, and one or more kinds of metal selected from the group of hard metals consisting of W, Mo, Cr, and Ni. In use of the substrate 10 formed of semiconductor material, the substrate 10 to which an element function, for example, a function of a zener diode, is added can be provided. A Cu—W or Cu—Mo complex is preferably used as the material for the metal substrate.

Junction Layer 20

A junction layer 20 may be a eutectic formed by bonding two substrates in the manufacturing step of the semiconductor light emitting element 1. In detail, the semiconductor side junction layer 21 shown in FIG. 5D and the substrate side junction layer 22 shown in FIG. 5E are bonded together. The material for the semiconductor side junction layer 21 is a laminate, for example, formed of titanium (Ti)/platinum (Pt)/gold (Au)/tin (Sn)/gold (Au) in that order from the lower side (from the protective film 80 side) as shown in FIG. 5D. The material for the substrate side junction layer 22 is a laminate, for example, formed of gold (Au)/platinum (Pt)/titanium disilicide ($TiSi_2$), or titanium disilicide ($TiSi_2$)/platinum (Pt)/palladium (Pd) in that order from the lower side (from the side opposite to the support substrate 10) as shown in FIG. 5E.

Reflection Layer 30

The reflection layer 30 may have a high reflectivity of light, and may be formed using material which can be used as an electrode. Suitable metallic materials for the reflection layer 30 include, for example, silver (Ag), aluminum (Al), zinc (Zn), nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chrome (Cr), tungsten (W), lanthanum (La), copper (Cu), and yttrium (Y). In particular, silver (Ag) or aluminum (Al) having a high reflectivity is preferable.

Protective Film 80

The protective film 80 may be formed of an insulating film, preferably, an oxide film. The protective film 80 can be formed of, for example, silicon dioxide ($SiO_2$), or a Zr oxide film ($ZrO_2$). When the protective film 80 can be formed of a dielectric multilayered film, specifically, a laminate formed by repeatedly laminating a $SiO_2$ film and another oxide film, for example, a laminate of $ZrO_2$ or $TiO_2$ and $SiO_2$.

Semiconductor Laminate 40

The semiconductor laminate 40 may be formed of a gallium nitride-based compound semiconductor represented by the following general formula: $In_xAl_yGa_{1-x-y}N$ ($0 \leq x \leq 1$, $0 \leq y \leq 1$, $0 \leq x+y \leq 1$). Suitable gallium nitride-based compound semiconductors include, for example, GaN, AlGaN, InGaN, AlGaInN, and the like. In particular, GaN is preferable since an etched surface has satisfactory crystallinity.

The n-type semiconductor layer 41 may be formed of, for example, GaN containing Si, Ge, O, and the like as n-type impurities. The n-type semiconductor layer 41 may be formed of a multilayer.

The light emitting layer 42 may be formed of, for example, InGaN.

The p-type semiconductor layer 43 may be formed of, for example, GaN containing Mg as p-type impurities.

n-side Pad 50

The n-side pads 50 may be connected to an external component by wire bonding. The n-side pad 50 may be formed of a multilayered film containing metals, for example, Ti/Pt/Au, Ti/Pt/Au/Ni, Ti/Al, Ti/Al/Pt/Au, W/Pt/Au, V/Pt/Au, Ti/TiN/Pt/Au, or Ti/TiN/Pt/Au/Ni, from the upper surface side of the n-type semiconductor layer 41. The n-type pad 50 may be formed of an ohmic electrode and a pad electrode.

Outer Protective Film 60

The outer protective film 60 may be formed of a transparent material having a reflective index lower than that of the n-type semiconductor layer 41. The outer protective film 60 covers the upper surface of the n-side pad 50 (except for the region to be subjected to wire bonding), and the surface and sides of the n-type semiconductor layer 41. The outer protective film 60 may be formed of an insulating film, preferably an oxide film. The outer protective film 60 may be formed of, for example, a silicon dioxide ($SiO_2$) film or a Zr oxide ($ZrO_2$) film.

Backside Metallized Layer 70

The backside metallized layer 70 serves as an ohmic electrode formed on the side opposite to the surface of the support substrate 10 with the junction layer 20 formed thereat. The material for the backside metallized layer 70 may be a laminate, for example, of titanium disilicide ($TiSi_2$)/platinum (Pt)/gold (Au) in that order from the upper side (support substrate 10 side) as shown in FIG. 2.

The semiconductor light emitting element according to the present invention can be used for all applications capable of applying the semiconductor light emitting element as a device, in various fields of, for example, illumination, exposure, a display, various methods of analysis, an optical network, and the like.

Other embodiments of the invention will be apparent to those skilled in the art from consideration of the specification and practice of the invention disclosed herein. It is intended that the specification and examples be considered as exemplary only.

What is claimed is:

1. A semiconductor light emitting element comprising:
   a semiconductor laminate including a p-type semiconductor layer, an active layer and an n-type semiconductor layer which are sequentially laminated; and
   a conductive support substrate joined to the p-type semiconductor layer side of the semiconductor laminate,
   wherein the semiconductor laminate is divided into at least two semiconductor regions by a trench penetrating the p-type semiconductor layer, the active layer and the n-type semiconductor layer,
   wherein the semiconductor light emitting element further comprises a continuous junction layer located between the conductive support substrate and the at least two semiconductor regions, at least a portion of the continuous junction layer being in direct contact with the semiconductor laminate of each semiconductor region, and
wherein the semiconductor light emitting element further comprises a reflection layer at a bottom of the trench.

2. The semiconductor light emitting element according to claim 1, wherein at least a portion of the reflection layer is disposed between the support substrate and the semiconductor laminate.

3. The semiconductor light emitting element according to claim 1, further comprising an insulating protective layer between the support substrate and the semiconductor laminate.

4. The semiconductor light emitting element according to claim 3, wherein the protective layer is also disposed at the bottom of the trench.

5. The semiconductor light emitting element according to claim 3, wherein the protective layer is formed of a dielectric multilayered film.

6. The semiconductor light emitting element according to claim 3, wherein said at least a portion of the continuous junction layer is in direct contact with each semiconductor region via respective through holes located in the insulating protective layer.

7. The semiconductor light emitting element according to claim 6, wherein the insulating protective layer is configured to reflect light emitted by the at least two semiconductor regions.

8. The semiconductor light emitting element according to claim 1, wherein
an insulating protective layer and the reflection layer are sequentially disposed in that order from the support substrate side between the support substrate and the semiconductor laminate, and
wherein the protective layer is also disposed at the bottom of the trench.

9. The semiconductor light element according to claim 8, wherein the protective layer is formed of a dielectric multilayered film.

10. The semiconductor light emitting element according to claim 1, wherein the trench has a width of 3 to 25 μm.

11. The semiconductor light emitting element according to claim 1, wherein:
a top view shape of the semiconductor light emitting element is rectangular, and
a ratio of a length of a side of the rectangular semiconductor light emitting element to a width of a trench extending in direction perpendicular to the side is 100:25 to 100:0.28.

12. The semiconductor light emitting element according to claim 1, further comprising:
an n-side pad for wire bonding disposed over each n-type semiconductor layer of the semiconductor regions,
wherein each of the n-side pads is disposed adjacent to a side of each of the corresponding semiconductor regions.

13. The semiconductor light emitting element according to claim 12, wherein
the semiconductor regions are disposed such that at least one side of each of the semiconductor regions is disposed at an outer periphery of the semiconductor light emitting element, and
each of the n-side pads is disposed adjacent to the at least one side of each of the semiconductor regions that is disposed at the outer periphery of the semiconductor light emitting element.

14. The semiconductor light emitting element according to claim 1, wherein a ratio of a thickness of the p-type semiconductor layer to a thickness of the n-type semiconductor layer is 1:50 to 1:3.

15. The semiconductor light emitting element according to claim 1, wherein a surface of the n-type semiconductor layer is roughened.

16. The semiconductor light emitting element according to claim 1,
wherein a top view shape of the semiconductor light emitting element is rectangular,
wherein a ratio of a length of a side of the rectangular semiconductor light emitting element to a width of a trench extending in direction perpendicular to the side is 100:25 to 100:0.28, and
wherein a ratio of a thickness of the p-type semiconductor layer to a thickness of the n-type semiconductor layer is 1:50 to 1:3.

17. The semiconductor light emitting element according to claim 16, further comprising:
an n-side pad for wire bonding disposed over each n-type semiconductor layer of the semiconductor regions,
wherein each of the n-side pads is disposed adjacent to a side of each of the corresponding semiconductor regions,
wherein the semiconductor regions are disposed such that at least one side of each of the semiconductor regions is disposed at an outer periphery of the semiconductor light emitting element, and
wherein each of the n-side pads is disposed adjacent to the at least one side of each of the semiconductor regions that is disposed at the outer periphery of the semiconductor light emitting element.

18. The semiconductor light emitting element according to claim 1, further comprising an insulating protective layer disposed at the bottom of the trench, the insulating protective layer being formed of a dielectric multilayered film.

19. The semiconductor light emitting element according to claim 1, further comprising a reflection layer disposed at the bottom of the trench, the reflection layer being formed of a metal film.

20. The semiconductor light emitting element according to claim 1, wherein each semiconductor region consists of the divided semiconductor laminate.

* * * * *

UNITED STATES PATENT AND TRADEMARK OFFICE
CERTIFICATE OF CORRECTION

| | | |
|---|---|---|
| PATENT NO. | : 9,093,356 B2 | Page 1 of 1 |
| APPLICATION NO. | : 13/336667 | |
| DATED | : July 28, 2015 | |
| INVENTOR(S) | : Nobuhiro Ubahara, Kouichiroh Deguchi and Takao Yamada | |

It is certified that error appears in the above-identified patent and that said Letters Patent is hereby corrected as shown below:

On the Title page, item [75], the first inventor's name is spelled incorrectly as "Nobuhiko Ubahara," and should be "Nobuhiro Ubahara".

Signed and Sealed this
Fifteenth Day of March, 2016

Michelle K. Lee
*Director of the United States Patent and Trademark Office*